US012198997B2

(12) United States Patent
Kim et al.

(10) Patent No.: US 12,198,997 B2
(45) Date of Patent: Jan. 14, 2025

(54) SEMICONDUCTOR PACKAGE COMPRISING FIRST MOLDING LAYER AND SECOND MOLDING LAYER WITH DIFFERENT THERMAL EXPANSION COEFFICIENTS

(71) Applicant: NEPES CO., LTD., Chungcheongbuk-do (KR)

(72) Inventors: Su Yun Kim, Cheongju-si (KR); Dong Hoon Oh, Seoul (KR); Yong Tae Kwon, Cheongju-si (KR); Jun Kyu Lee, Cheongju-si (KR); Kyeong Rok Shin, Gwangju (KR); Yong Woon Yeo, Cheongju-si (KR)

(73) Assignee: NEPES CO., LTD., Chungcheongbuk-do (KR)

( * ) Notice: Subject to any disclaimer, the term of this patent is extended or adjusted under 35 U.S.C. 154(b) by 798 days.

(21) Appl. No.: 17/287,637

(22) PCT Filed: Oct. 17, 2019

(86) PCT No.: PCT/KR2019/013639
§ 371 (c)(1),
(2) Date: Apr. 22, 2021

(87) PCT Pub. No.: WO2020/085715
PCT Pub. Date: Apr. 30, 2020

(65) Prior Publication Data
US 2021/0398869 A1 Dec. 23, 2021

(30) Foreign Application Priority Data

Oct. 26, 2018 (KR) .................. 10-2018-0129346
Dec. 26, 2018 (KR) .................. 10-2018-0169901

(51) Int. Cl.
| H01L 23/31 | (2006.01) |
| H01L 23/498 | (2006.01) |
| H01L 23/552 | (2006.01) |

(52) U.S. Cl.
CPC .... H01L 23/3128 (2013.01); H01L 23/49816 (2013.01); H01L 23/552 (2013.01)

(58) Field of Classification Search
None
See application file for complete search history.

(56) References Cited

U.S. PATENT DOCUMENTS 9,653,397 B2  5/2017  Kwon et al.
9,865,552 B2  1/2018  Ryu et al.
(Continued)

FOREIGN PATENT DOCUMENTS

KR  10-2015-0078161 A    7/2015
KR      2015078161 A  *  7/2015  ............. H01L 23/28
(Continued)

OTHER PUBLICATIONS

International Search Report for corresponding International Patent Application No. PCT/KR2019/013639, mailed Feb. 29, 2020, 7 pgs., with English translation.
(Continued)

*Primary Examiner* — Daniel Whalen
(74) *Attorney, Agent, or Firm* — Crowell & Moring LLP

(57) ABSTRACT

A semiconductor package includes an upper structure including a semiconductor chip and a first molding layer for molding the semiconductor chip, a lower structure provided on the upper structure, the lower structure including a conductive post and a second molding layer for molding the conductive post, and a redistribution structure provided between the upper structure and the lower structure, the redistribution structure including a wiring pattern for elec- (Continued)

trically connecting a pad of the semiconductor chip to the conductive post, in which a thermal expansion coefficient of the second molding layer is different from a thermal expansion coefficient of the first molding layer.

13 Claims, 35 Drawing Sheets

(56) References Cited

U.S. PATENT DOCUMENTS

| | | | |
|---|---|---|---|
| 10,170,456 B2 | 1/2019 | Sung et al. | |
| 2014/0377909 A1* | 12/2014 | Chung | H01L 25/03 438/113 |
| 2016/0365319 A1* | 12/2016 | Ryu | H01L 21/561 |

FOREIGN PATENT DOCUMENTS

| | | |
|---|---|---|
| KR | 10-2016-0039752 A | 4/2016 |
| KR | 10-2016-0146035 A | 12/2016 |
| KR | 10-2017-0099514 A | 9/2017 |
| KR | 10-2018-0071138 A | 6/2018 |

OTHER PUBLICATIONS

Notice of Allowance for Korean Application No. 10-2018-0129346, mailed Oct. 22, 2020, 4 pgs., with English machine translation.

Notice of Allowance for Korean Application No. 10-2018-0169901, mailed Sep. 24, 2020, 4 pgs., with English machine translation.

Notice of Opinion Submission for Korean Application No. 10-2018-0129346, mailed Jan. 31, 2020, 13 pgs. with English machine translation.

Notice of Opinion Submission for Korean Application No. 10-2018-0169901, mailed Feb. 21, 2020, 8 pgs., with English machine translation.

Written Opinion for corresponding International Patent Application No. PCT/KR2019/013639, mailed Feb. 25, 2020, 10 pgs., with English machine translation.

\* cited by examiner

SEMICONDUCTOR PACKAGE COMPRISING FIRST MOLDING LAYER AND SECOND MOLDING LAYER WITH DIFFERENT THERMAL EXPANSION COEFFICIENTS

CROSS REFERENCE TO RELATED APPLICATIONS

This application is the U.S. National Stage application of PCT application no. PCT/KR2019/013639, filed on Oct. 17, 2019, titled "Semiconductor Package," designating the United States the content of which is incorporated herein by reference in its entirety. PCT application no. PCT/KR2019/013639 claims priority from Korean Patent Application no. 10-2018-0169901 filed on Dec. 26, 2018, the content of which is incorporated herein by reference in its entirety. PCT application no. PCT/KR2019/013639 also claims priority to Korean Patent Application no. 10-2018-0129346 filed on Oct. 26, 2018, the content of which is incorporated herein by reference in its entirety.

TECHNICAL FIELD

The disclosure relates to a semiconductor package.

BACKGROUND ART

Generally, semiconductor packages are manufactured by performing a semiconductor package process on semiconductor chips that are manufactured by performing various semiconductor processes on a wafer. Recently, to reduce manufacturing costs of semiconductor packages, a wafer-level package technology has been suggested, in which a semiconductor package process is performed at a wafer level and a wafer-level semiconductor package that has undergone the semiconductor package process is individualized into individual units.

In recent years, according to the trend of miniaturization of electronic devices, semiconductor packages are gradually smaller and thinner. For a thin semiconductor package, there is a problem of warpage due to a difference in thermal expansion coefficient between components constituting a semiconductor package or a difference in thermal expansion coefficient between a semiconductor package and a circuit substrate on which the semiconductor package is mounted. As the warpage causes mechanical defects and electrical defects of a semiconductor package and/or a semiconductor module, various efforts to prevent the warpage of a semiconductor package and/or a semiconductor module have been conducted.

DESCRIPTION OF EMBODIMENTS

Technical Problem

Provided is a semiconductor package.

Solution to Problem

According to an aspect of the disclosure, a semiconductor package includes an upper structure including a semiconductor chip and a first molding layer for molding the semiconductor chip, a lower structure provided on the upper structure, the lower structure including a conductive post and a second molding layer for molding the conductive post, and a redistribution structure provided between the upper structure and the lower structure, the redistribution structure including a wiring pattern for electrically connecting a pad of the semiconductor chip to the conductive post, in which a thermal expansion coefficient of the second molding layer is different from a thermal expansion coefficient of the first molding layer.

In some embodiments, the redistribution structure may include an insulating pattern covering the wiring pattern, and the conductive post includes a first portion surrounded by the insulating pattern and a second portion surrounded by the second molding layer.

In some embodiments, a width of the first portion of the conductive post may be less than a width of the second portion of the conductive post.

In some embodiments, the semiconductor package may further include an external connection terminal directly connected to one end of the conductive post.

In some embodiments, the lower structure further may include a lower insulating layer provided on the second molding layer and includes an opening for exposing the conductive post.

In some embodiments, the semiconductor package may further include a lower redistribution structure provided on the lower structure, the lower redistribution structure including a lower wiring pattern electrically connected to the conductive post and a lower insulating pattern covering the lower wiring pattern.

In some embodiments, the upper structure further may include a heat dissipation plate provided on the semiconductor chip.

In some embodiments, the second molding layer may include a plurality of sub-molding layers that are sequentially stacked on the redistribution structure, and the plurality of sub-molding layers have thermal expansion coefficients that are different from each other. According to another aspect of the disclosure, a semiconductor module includes a circuit substrate and a semiconductor package mounted on the circuit substrate, the semiconductor package including a semiconductor chip, a first molding layer surrounding the semiconductor chip and having a first thermal expansion coefficient, a redistribution structure including a wiring pattern electrically connected to the semiconductor chip, a second molding layer provided between the first molding layer and the circuit substrate and having a second thermal expansion coefficient between a thermal expansion coefficient of the circuit substrate and the first thermal expansion coefficient, and a conductive post penetrating the second molding layer and electrically connected to the wiring pattern.

In some embodiments, the redistribution structure may further include an insulating pattern provided between the first molding layer and the second molding layer and covering the wiring pattern, and the conductive post may be connected to the wiring pattern by penetrating the insulating pattern.

In some embodiments, the semiconductor module may further include a lower insulating layer provided on the second molding layer, and an external connection terminal directly connected to the conductive post through an opening of the lower insulating layer, and configured to electrically connect the conductive post to a substrate pad of the circuit substrate.

In some embodiments, the second molding layer may include a first sub-molding layer and a second sub-molding layer, which are sequentially stacked on the redistribution structure, and a thermal expansion coefficient of the first sub-molding layer is between a thermal expansion coefficient of the first molding layer and a thermal expansion coefficient of the second sub-molding layer.

According to another aspect of the disclosure, a semiconductor package includes a semiconductor chip, a first insulating pattern on the semiconductor chip, a first conductive bump connected to a chip pad of the semiconductor chip by penetrating the first insulating pattern and protruding from an upper surface of the first insulating pattern, and a wiring pattern extending along the upper surface of the first insulating pattern and connected to the first conductive bump.

In some embodiments, the wiring pattern may be in contact with a side wall of the first conductive bump and an upper surface of the first conductive bump, the first conductive bump protruding from the upper surface of the first insulating pattern.

In some embodiments, the wiring pattern may have a step portion corresponding to a height of the first conductive bump protruding from the upper surface of the first insulating pattern.

In some embodiments, the semiconductor package may further include a second insulating pattern provided on the first insulating pattern, wherein a lower surface of the second insulating pattern is in contact with the upper surface of the first insulating pattern, and a surface roughness of the upper surface of the first insulating pattern is greater than a surface roughness of the lower surface of the second insulating pattern.

In some embodiments, the semiconductor package may further include a second insulating pattern provided on the first insulating pattern, and a second conductive bump connected to the wiring pattern by penetrating the second insulating pattern, and protruding from an upper surface of the insulating pattern.

In some embodiments, a lower portion of the second conductive bump may be in contact with the upper surface of the first insulating pattern by penetrating the wiring pattern.

In some embodiments, the semiconductor package may further include an external connection terminal on the second conductive bump, wherein the external connection terminal covers a side wall of the second conductive bump, the second conductive bump protruding from the upper surface of the second insulating pattern.

In some embodiments, the semiconductor package may further include a shield layer provided in the first insulating pattern and spaced apart from the first conductive bump.

In some embodiments, the shield layer may have a plate shape and include an opening through which the first conductive bump passes.

In some embodiments, the shield layer may have a mesh shape and include an opening through which the first conductive bump passes.

Advantageous Effects of Disclosure

According to the disclosure, as a first molding layer for molding a first semiconductor chip and a second molding layer for molding a conductive post are arranged spaced apart from each other with a redistribution structure therebetween, stress applied to the first molding layer and the stress applied to the second molding layer are balanced and offset each other. Accordingly, warpage of a semiconductor package may be prevented.

Furthermore, according to the disclosure, as the second molding layer is arranged between the first molding layer for molding the first semiconductor chip and the circuit substrate on which the semiconductor package is mounted, the second molding layer may reduce thermal expansion stress generated due to a difference in thermal expansion coefficient between the semiconductor package and the circuit substrate, thereby preventing warpage of the semiconductor package and a semiconductor module.

According to the disclosure, as a first conductive bump protrudes from a first insulating pattern, a first wiring pattern is in contact with a side wall of the first conductive bump, and a contact area between the first wiring pattern and the first conductive bump may increase, thereby contact resistance between the first wiring pattern and the first conductive bump may be reduced.

Furthermore, according to the disclosure, as the first insulating pattern and a second insulating pattern are relatively thick and function as buffers to external shocks, reliability of the semiconductor package may be enhanced.

BEST MODE

Figure 1:
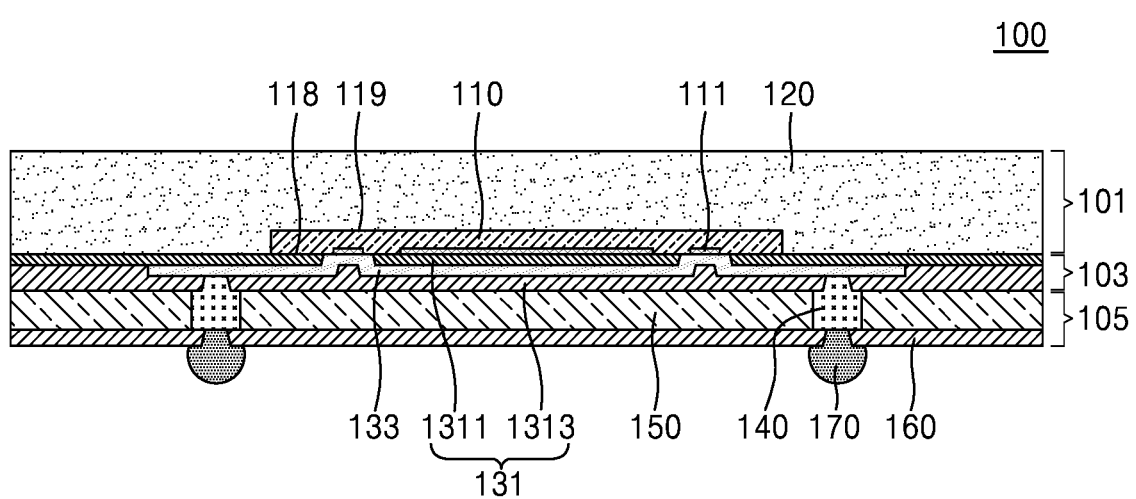
FIG. 1 is a cross-sectional view of a semiconductor package according to embodiments of the disclosure.

According to the disclosure, a semiconductor package includes an upper structure including a semiconductor chip and a first molding layer for molding the semiconductor chip, a lower structure provided on the upper structure, the lower structure including a conductive post and a second molding layer for molding the conductive post, and a redistribution structure provided between the upper structure and the lower structure, the redistribution structure including a wiring pattern for electrically connecting a pad of the semiconductor chip to the conductive post, in which a thermal expansion coefficient of the second molding layer is different from a thermal expansion coefficient of the first molding layer.

MODE OF DISCLOSURE

The disclosure will now be described more fully with reference to the accompanying drawings, in which embodiments of the disclosure are shown. The disclosure may, however, be embodied in many different forms and should not be construed as being limited to the embodiments set forth herein; rather, these embodiments are provided so that this disclosure will be thorough and complete, and will fully convey the concept of the disclosure to those of ordinary skill in the art. In the drawings, the thicknesses of layers and regions are exaggerated for clarity. Furthermore, various components and regions are schematically drawn in the drawings. Accordingly, the inventive concept is not limited to relative sizes or intervals drawn in the accompanying drawings.

Terms such as "first" and "second" are used herein merely to describe a variety of constituent elements, but the constituent elements are not limited by the terms. Such terms are used only for the purpose of distinguishing one constituent element from another constituent element. For example, without departing from the right scope of the disclosure, a first constituent element may be referred to as a second constituent element, and vice versa.

Terms used in the specification are used for explaining a specific embodiment, not for limiting the disclosure. Thus, the expression of singularity in the specification includes the expression of plurality unless clearly specified otherwise in context. Also, terms such as "comprise" and/or "comprising" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Unless defined otherwise, all terms used herein including technical or scientific terms have the same meanings as those generally understood by those of ordinary skill in the art to which the disclosure may pertain. Furthermore, the terms as those defined in generally used dictionaries are construed to have meanings matching that in the context of related technology and, unless clearly defined otherwise, are not construed to be ideally or excessively formal.

FIG. 1 is a cross-sectional view of a semiconductor package 100 according to embodiments of the disclosure.

Referring to FIG. 1, the semiconductor package 100 may include an upper structure 101 including a semiconductor chip 110 and a first molding layer 120 for molding the semiconductor chip 110, a lower structure 105 including a conductive post 140 electrically connected to the semiconductor chip 110 and a second molding layer 150 for molding the conductive post 140, and a redistribution structure 103 provided between the upper structure 101 and the lower structure 105. The upper structure 101 and the lower structure 105 may be stacked in a vertical direction. The semiconductor package 100 may have, for example, a fan-out wafer-level package (FOWLP) structure.

The upper structure 101 may include the semiconductor chip 110 and the first molding layer 120 for molding the semiconductor chip 110.

Various types of a plurality of individual devices may be formed on the semiconductor chip 110. For example, the individual devices may include various microelectronic devices, for example, metal-oxide-semiconductor field effect transistors (MOSFETs) such as complementary metal-insulator-semiconductor (CMOS) transistors and the like, system large scale integration (LSI), image sensors such as CMOS imaging sensors (CISs) and the like, micro-electromechanical systems (MEMSs), active devices, passive devices, and the like.

The semiconductor chip 110 may include a first surface 118 and a second surface 119 opposite to the first surface 118. The first surface 118 of the semiconductor chip 110 may be a pad surface on which a pad 111 is provided. The pad 111 may be electrically connected to a semiconductor device formed on the semiconductor chip 110. The first surface 118 of the semiconductor chip 110 may not be covered by the first molding layer 120 and may be in contact with the redistribution structure 103. In detail, although not illustrated, the semiconductor chip 110 may include a passivation film that covers the first surface 118.

In some embodiments, the semiconductor chip 110 may include, for example, a memory semiconductor chip. The memory semiconductor chip may include, for example, volatile memory semiconductor chips such as dynamic random access memory (DRAM) or static random access memory (SRAM), or non-volatile memory semiconductor chips such as phase-change random access memory (PRAM), magnetoresistive random access memory (MRAM), ferroelectric random access memory (FeRAM), or resistive random access memory (RRAM).

Alternatively, in some embodiments, the semiconductor chip 110 may include a logic chip. For example, the semiconductor chip 110 may include a central processor unit (CPU), a microprocessor unit (MPU), a graphic processor unit (GPU), or an application processor (AP).

Furthermore, although FIG. 1 illustrates that the semiconductor package 100 includes one semiconductor chip, the semiconductor package 100 may include two or more semiconductor chips. For example, the semiconductor chip 110 may be a chip stack in which two or more semiconductor chips are vertically stacked. The two or more semiconductor chips included in the semiconductor package 100 may be homogeneous semiconductor chips or heterogeneous semiconductor chips. In some embodiments, the semiconductor package 100 may be a system in package (SIP) in which different types of semiconductor chips and electronic components are electrically connected to each other to operate as one system.

The first molding layer 120 may cover at least part of the semiconductor chip 110. For example, the first molding layer 120 may cover the second surface 119 and a side surface of the semiconductor chip 110. In other embodiments, unlike the illustration of FIG. 1, the first molding layer 120 may expose the second surface 119 of the semiconductor chip 110.

In some embodiments, the first molding layer 120 may include an insulating material, for example, epoxy mold compound (EMC), epoxy resin, silicon resin, or polyimide resin.

The redistribution structure 103 may be provided between the upper structure 101 and the lower structure 105, and may include an insulating pattern 131 and a wiring pattern 133.

The insulating pattern 131 may be arranged on the first surface 118 of the semiconductor chip 110. The insulating pattern 131 may have a structure in which a plurality of insulating films are stacked, for example, a first insulating pattern 1311 and a second insulating pattern 1313, which are sequentially stacked.

The wiring pattern 133 may be electrically connected to the pad 111 of the semiconductor chip 110. The wiring pattern 133 may provide an electrical connection path through which the pad 111 of the semiconductor chip 110 is electrically connected to an external device, and may electrically connect the pad 111 of the semiconductor chip 110 to the conductive post 140.

In detail, the first insulating pattern 1311 may cover the first surface 118 of the semiconductor chip 110 and may have an opening for exposing part of the pad 111. The wiring pattern 133 may be arranged on the first insulating pattern 1311, and may be connected to the pad 111 through the opening of the first insulating pattern 1311. Furthermore, the second insulating pattern 1313 may be formed on the first insulating pattern 1311 to cover the wiring pattern 133, and may have an opening for exposing part of the wiring pattern 133. The conductive post 140 may be connected to first the wiring pattern 133 through an opening of the second insulating pattern 1313.

In some embodiments, the insulating pattern 131 may include an insulating polymer, epoxy, a silicon oxide film, a silicon nitride film, an insulating polymer, or a combination thereof.

In some embodiments, the first insulating pattern 1311 and the second insulating pattern 1313 constituting the insulating pattern 131 may include the same material. Alternatively, in some embodiments, the first insulating pattern 1311 and the second insulating pattern 1313 constituting the insulating pattern 131 may include materials different from each other.

In some embodiments, the wiring pattern 133 may include a conductive material, for example, W, Cu, Zr, Ti, Ta, Al, Ru, Pd, Pt, Co, Ni, or a combination thereof.

Although FIG. 1 illustrates that the insulating pattern 131 includes the first insulating pattern 1311 and the second insulating pattern 1313, the disclosure is not limited thereto. For example, the insulating pattern 131 may have a single layer structure or a structure in which three or more insulating films are stacked. Furthermore, although FIG. 1 illustrates that the wiring pattern 133 has a single layer structure, the disclosure is not limited thereto. For example, the wiring pattern 133 may have a structure in which two or more wiring layers are stacked.

The lower structure 105 may be provided on the redistribution structure 103, and may include the conductive post 140 and the second molding layer 150 for molding the conductive post 140.

The conductive post 140 may be provided on the wiring pattern 133, and may be electrically connected to the pad 111 of the semiconductor chip 110 through the wiring pattern 133. The conductive post 140 may include a conductive material, for example, a metal material. For example, the conductive post 140 may include copper (Cu), aluminum (Al), a copper alloy, or an aluminum alloy.

The second molding layer 150 may be provided on the redistribution structure 103, and may surround at least part of the conductive post 140. In some embodiments, the second molding layer 150 may include an insulating material, for example, an epoxy molding compound, epoxy resin, silicon resin, or polyimide resin.

In some embodiments, the lower structure 105 may include a lower insulating layer 160 that is provided on a lower surface of the second molding layer 150 opposite to an upper surface of the second molding layer 150 facing the redistribution structure 103. The lower insulating layer 160 may have an opening for exposing at least part of the conductive post 140, and the conductive post 140 may be connected to an external connection terminal through the opening.

The conductive post 140 may have a through mold via structure that penetrates the second molding layer 150. One end of the conductive post 140 may be connected to the wiring pattern 133, and the conductive post 140 may be connected to the wiring pattern 133 by penetrating the insulating pattern 131. The external connection terminal 170 may be arranged on the other end of the conductive post 140. The external connection terminal 170 may include, for example, a solder ball or a solder bump. The external connection terminal 170 may be electrically connected to the pad 111 of the semiconductor chip 110 through the conductive post 140 and the wiring pattern 133, and may be configured to electrically connect the semiconductor package 100 to the external device.

In some embodiments, the conductive post 140 may have a step structure. In detail, a first portion of the conductive post 140 surrounded by the insulating pattern 131 may have a width less than a second portion of the conductive post 140 surrounded by the second molding layer 150, and thus, a step structure may be formed on a side surface of the conductive post 140.

Figure 2:
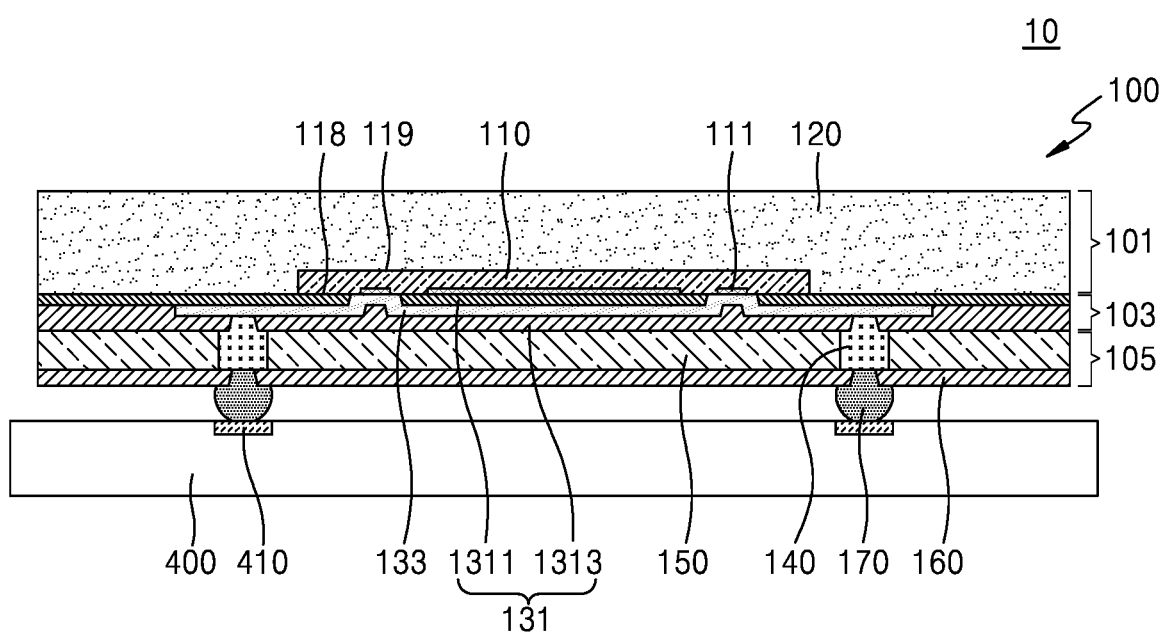
FIG. 2 is a cross-sectional view of a semiconductor module including the semiconductor package of FIG. 1.

The second molding layer 150 of the lower structure 105 may buffer thermal expansion stress applied to the semiconductor package 100 and/or the semiconductor chip 110 due to a difference in thermal expansion coefficient (CTE) between the semiconductor package 100 and a circuit substrate 400 of FIG. 2 on which the semiconductor package 100 is mounted. Furthermore, as the first molding layer 120 and the second molding layer 150 are arranged opposite to each other with the redistribution structure 103 and the semiconductor chip 110 therebetween, stress applied to the first molding layer 120 and stress applied to the second molding layer 150 may be balanced and offset each other. Accordingly, warpage of the semiconductor package 100 may be prevented.

In some embodiments, the second molding layer 150 may have a thickness suitable for reducing thermal expansion stress applied to the semiconductor package 100. For example, the second molding layer 150 may have a thickness of about 20 micrometers to about 200 micrometers.

FIG. 2 is a cross-sectional view of a semiconductor module 10 including the semiconductor package 100 of FIG. 1.

Referring to FIG. 2, the semiconductor module 10 may include a circuit substrate 400 and the semiconductor package 100 mounted on the circuit substrate 400. The external connection terminal 170 may be provided between the semiconductor package 100 and the circuit substrate 400, and the conductive post 140 of the semiconductor package 100 and a substrate pad 410 of the circuit substrate 400 may be electrically connected to each other. The circuit substrate 400 may electrically transmit/receive electrical signals with respect to the semiconductor chip 110 through the external connection terminal 170, the conductive post 140, and the wiring pattern 133.

The circuit substrate 400 may be a printed circuit board (PCB), but the disclosure is not limited thereto. For example, the circuit substrate 400 may be a circuit substrate of a metal core PCB (MCPCB), a metal PCB (MPCB), a flexible PCB (FPCB), and the like.

In some embodiments, a second thermal expansion coefficient of the second molding layer 150 may have a value between a first thermal expansion coefficient of the first molding layer 120 and a thermal expansion coefficient of the circuit substrate 400. The second molding layer 150 may be provided between the first molding layer 120 for molding the semiconductor chip 110 and the circuit substrate 400, and may reduce a difference in thermal expansion coefficient between the semiconductor package 100 and the circuit substrate 400, thereby reducing warpage due to the thermal expansion stress. As the warpage of the semiconductor package 100 is prevented, generation of cracks in the external connection terminal 170 provided between the semiconductor package 100 and the circuit substrate 400 is remarkably reduced, and thus, the reliability of the semiconductor package 100 may be much enhanced.

In some embodiments, the circuit substrate 400 may be a printed circuit board, and the thermal expansion coefficient of the circuit substrate 400 may be greater than the first thermal expansion coefficient of the first molding layer 120. In this case, the second thermal expansion coefficient of the second molding layer 150 may have a value that is greater than the first thermal expansion coefficient of the first molding layer 120 and less than thermal expansion coefficient of the circuit substrate 400. For example, the second thermal expansion coefficient of the second molding layer 150 may be between about 10 $\mu m \cdot m^{-1} \cdot k^{-1}$ and about 16 $\mu m \cdot m^{-1} \cdot k^{-1}$.

Furthermore, the first molding layer 120 and the second molding layer 150 may have a thickness ratio suitable for enhancing the warpage of the semiconductor package 100. In some embodiments, a thickness of the second molding layer 150 may be about 0.5 times or more than a thickness of the first molding layer 120, for example, the thickness of the second molding layer 150 may be about one time or about twice or more than the thickness of the first molding layer 120. Furthermore, in some embodiments, the thickness of the second molding layer 150 may be about 1000 times or less than the thickness of the first molding layer 120, for example, the second molding layer 150 may have a thickness of about one hundred times or ten times or less than the thickness of the first molding layer 120. By adjusting a thickness ratio of the first molding layer 120 and the second molding layer 150 to be suitable for preventing the warpage of the semiconductor package 100, damage to the external connection terminal 170 due to the warpage of the semiconductor package 100 may be prevented, and moreover the reliability of the semiconductor package 100 may be enhanced.

FIGS. 3A to 3K are cross-sectional views of a method of manufacturing the semiconductor package 100 of FIG. 1 in order.

Figure 3A:
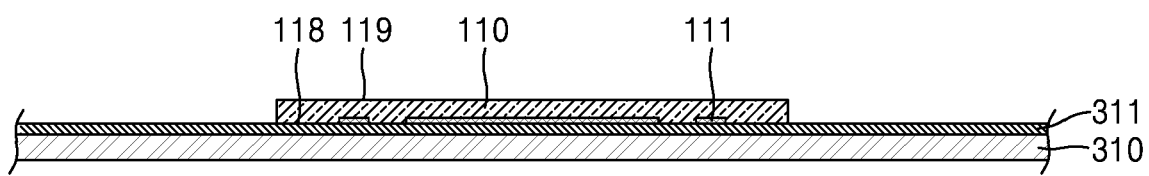
FIGS. 3A to 3K are cross-sectional views of a method of manufacturing the semiconductor package of FIG. 1 in order.

Referring to FIG. 3A, the semiconductor chip 110 is arranged on a carrier substrate 310. The carrier substrate 310 may include an adhesive layer 311 that adheres and fixes the semiconductor chip 110, and the semiconductor chip 110 may be arranged on the carrier substrate 310 so that the first surface 118 on which the pad 111 is provided adheres to the adhesive layer 311.

Figure 3B:
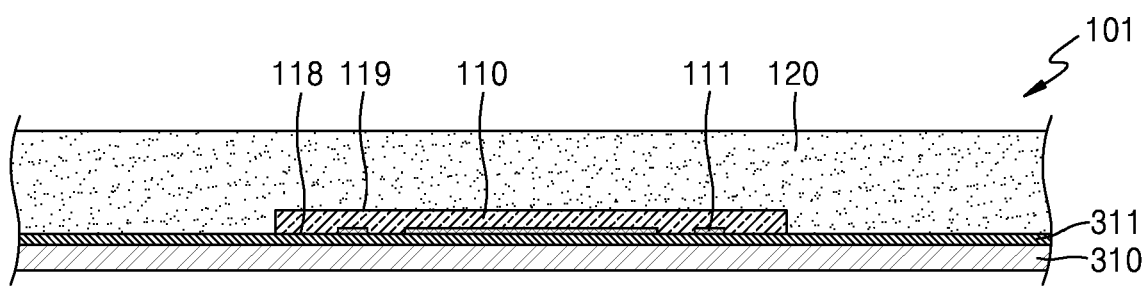

Referring to FIG. 3B, after the semiconductor chip 110 is formed on the carrier substrate 310, the first molding layer 120 covering the semiconductor chip 110 is formed. The first molding layer 120 may be formed to cover the side surface and the second surface 119 of the semiconductor chip 110. The first molding layer 120 may be formed by applying a molding material such as an epoxy molding compound, epoxy resin, silicon resin, or polyimide resin, to the carrier substrate 310, and curing the molding material. The first semiconductor chip 110 and the first molding layer 120 may constitute the upper structure 101.

Figure 3C:
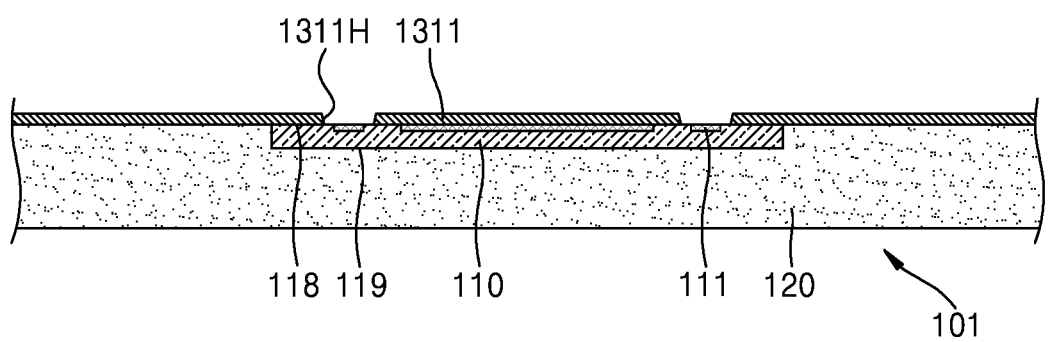
Figure 3D:
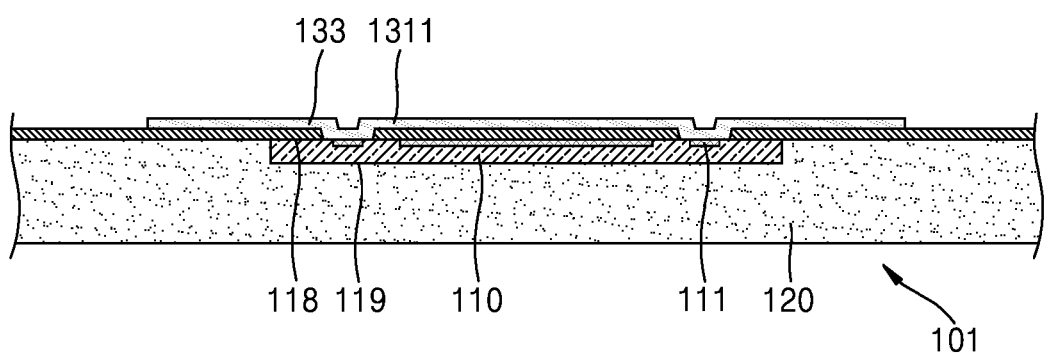
Figure 3E:
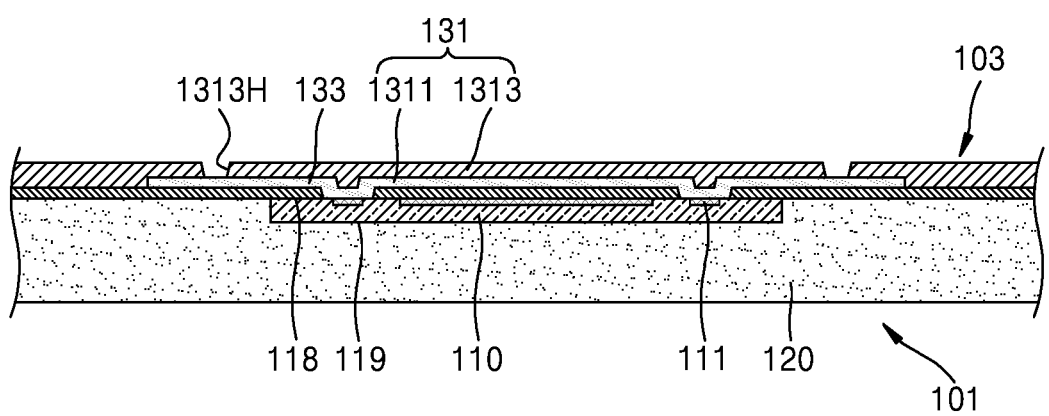

Referring to FIGS. 3C to 3E, after the first molding layer 120 is formed, the upper structure 101 may be separated from the carrier substrate 310, and the redistribution structure 103 may be formed on the upper structure 101.

First, as illustrated in FIG. 3C, the first insulating pattern 1311 is formed on the first surface 118 of the semiconductor chip 110 and a surface of the first molding layer 120. To form the first insulating pattern 1311, an insulating film may be formed on a surface of the upper structure 101, and an opening 1311H for exposing the pad 111 of the semiconductor chip 110 may be formed by removing part of the insulating film.

Next, as illustrated in FIG. 3D, the wiring pattern 133 is formed on the first insulating pattern 1311. The wiring pattern 133 may extend on the first insulating pattern 1311, and may be connected to the pad 111 of the semiconductor chip 110 through the opening 1311H of FIG. 3C of the first insulating pattern 1311. For example, the wiring pattern 133 may be formed through a seed film forming process, a mask process, and an electroplating process.

Next, as illustrated in FIG. 3E, the second insulating pattern 1313 covering the wiring pattern 133 is formed. To form the second insulating pattern 1313, an insulating film covering the wiring pattern 133 and the first insulating pattern 1311 may be formed, and an opening 1313H for exposing the wiring pattern 133 may be formed by removing part of the insulating film.

Figure 3F:
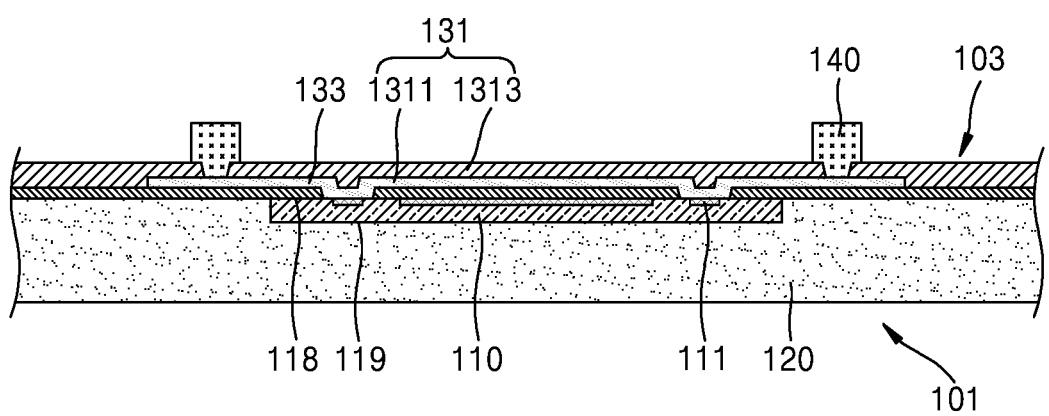

Referring to FIG. 3F, after the redistribution structure 103 is formed, the conductive post 140 connected to the wiring pattern 133 is formed. The conductive post 140 may extend in the vertical direction, and a lower portion of the conductive post 140 may be connected to the wiring pattern 133 through the opening 1313H of the second insulating pattern 1313. To form the conductive post 140, processes of forming a mask layer on the redistribution structure 103, forming an opening for exposing the wiring pattern 133 by removing part of the mask layer, filling the opening of the mask layer with a conductive material, and removing the mask layer through an ashing or etching process may be sequentially performed. In some embodiments, a plating process may be performed to form a conductive material in the opening of the mask layer.

Figure 3G:
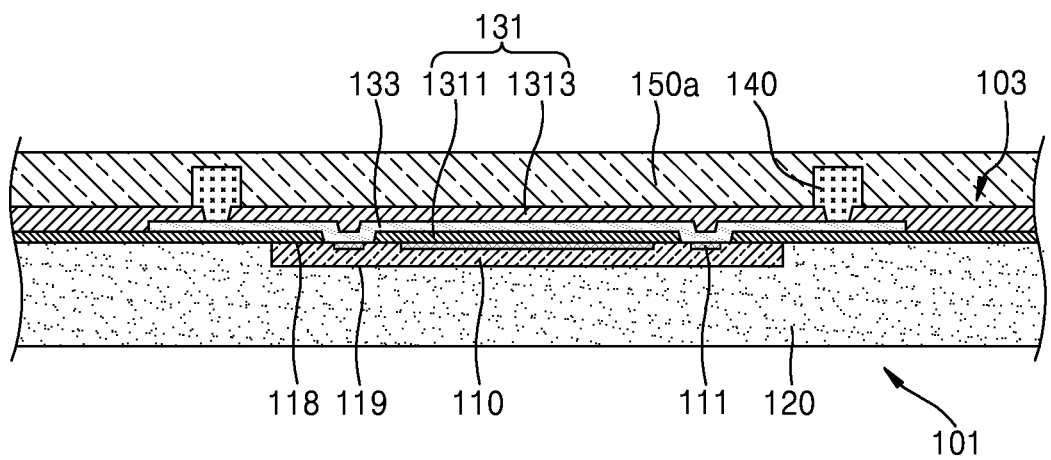

Referring to FIG. 3G, after the conductive post 140 is formed, a second preliminary molding layer 150a covering the conductive post 140 is formed on the redistribution structure 103. The second preliminary molding layer 150a may be formed by applying a molding material such as an epoxy molding compound, epoxy resin, silicon resin, or polyimide resin to the redistribution structure 103, and curing the molding material.

Figure 3H:
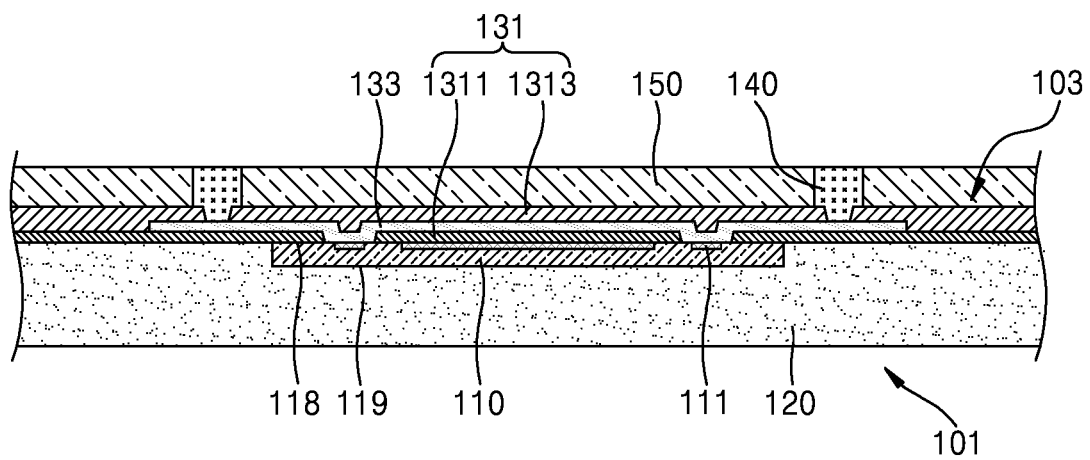

Referring to FIG. 3H, the second molding layer 150 surrounding the side surface of the conductive post 140 may be formed by removing an upper portion of the second preliminary molding layer 150a of FIG. 3G. As the upper portion of the second preliminary molding layer 150a is removed, an upper surface of the conductive post 140 may be exposed to the outside, and the side surface of the conductive post 140 may be covered by the second molding layer 150. For example, chemical mechanical polishing (CMP) may be performed to remove the upper portion of the second preliminary molding layer 150a. The upper surface of the second molding layer 150 and the upper surface of the conductive post 140 exposed by the second molding layer 150 may be placed on the same plane through the CMP process.

Figure 3I:
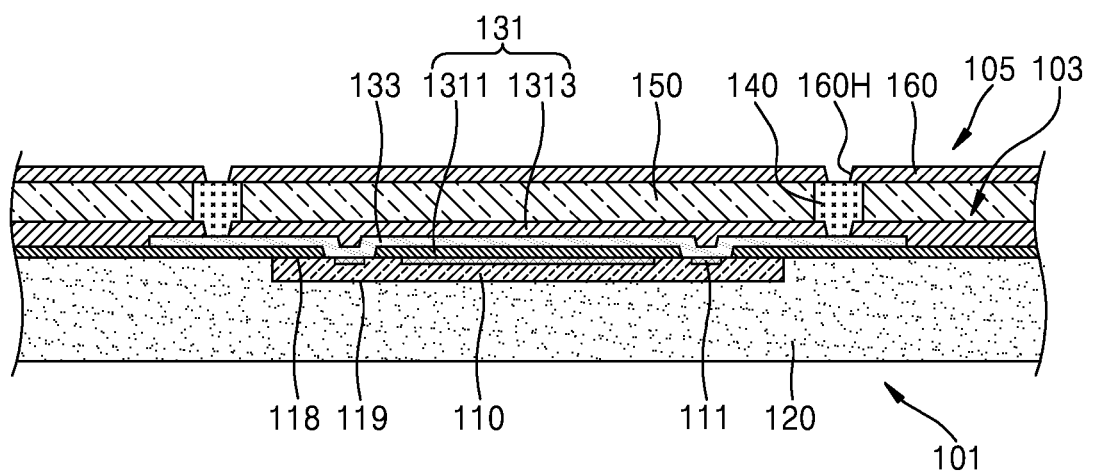

Referring to FIG. 3I, after the second molding layer 150 is formed, the lower insulating layer 160 is formed on the second molding layer 150. To form the lower insulating layer 160, an insulating film may be formed on the second molding layer 150, and an opening 160H for exposing the conductive post 140 may be formed by removing part of the insulating film. The conductive post 140, the second molding layer 150, and the lower insulating layer 160 may constitute the lower structure 105.

Figure 3J:
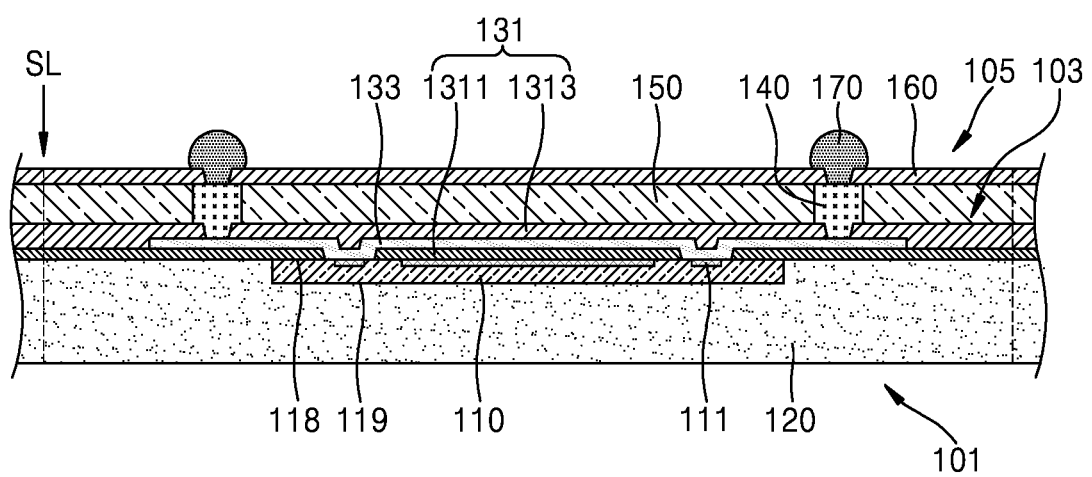

Referring to FIG. 3J, after the lower insulating layer 160 is formed, the external connection terminal 170 may be formed on the conductive post 140 that is exposed by the opening 160H of FIG. 3I of the lower insulating layer 160. The external connection terminal 170 may include, for example, a solder ball or a solder bump.

Figure 3K:
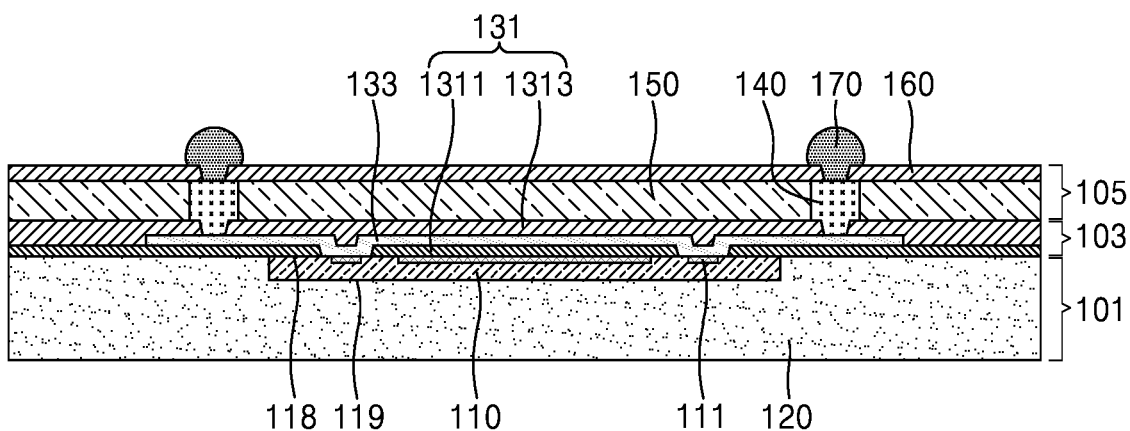

Referring to FIG. 3K, after the external connection terminal 170 is formed, semiconductor packages may be individualized into individual semiconductor packages through a sawing process. In other words, the semiconductor package illustrated in FIG. 3J may be cut along a scribe lane SL of FIG. 3J and then separated into a plurality of individual semiconductor packages.

Figure 4:
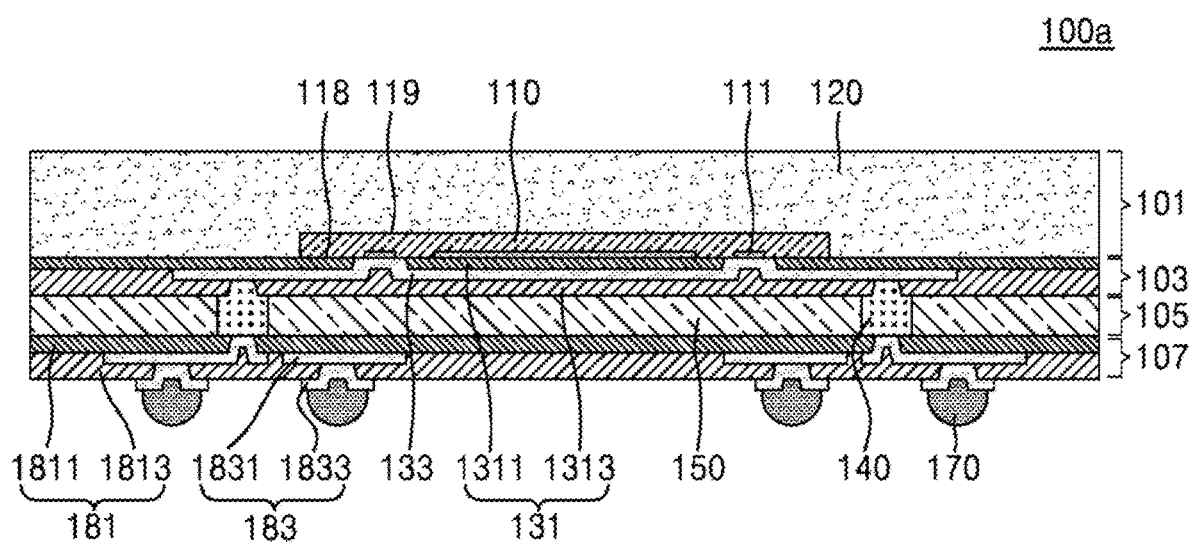
FIG. 4 is a cross-sectional view of a semiconductor package according to embodiments of the disclosure.

FIG. 4 is a cross-sectional view of a semiconductor package 100a according to embodiments of the disclosure. The semiconductor package 100a illustrated in FIG. 4 may have substantially the same configuration as the semiconductor package 100 of FIG. 1, except that the semiconductor package 100a of FIG. 4 further includes a lower redistribution structure 107.

Referring to FIG. 4, the semiconductor package 100a may include the upper structure 101 including the semiconductor chip 110 and the first molding layer 120 for molding the semiconductor chip 110, the lower structure 105 including the conductive post 140 electrically connected to the semiconductor chip 110 and the second molding layer 150 for molding the conductive post 140, the redistribution structure 103 provided between the upper structure 101 and the lower structure 105, and the lower redistribution structure 107 provided on the lower structure 105.

The lower redistribution structure 107 may be provided on the lower structure 105, and may include a lower insulating pattern 181 and a lower wiring pattern 183.

The lower insulating pattern 181 may have a structure in which a plurality of insulating films are stacked, for example, a first lower insulating pattern 1811 and a second lower insulating pattern 1813, which are sequentially stacked.

The lower wiring pattern 183 may be electrically connected to the conductive post 140. The lower wiring pattern 183 may electrically connect the conductive post 140 to the external connection terminal 170. The lower wiring pattern 183 may have a multilayer structure and may include, for example, a first lower wiring pattern 1831 and a second lower wiring pattern 1833.

In detail, the first lower insulating pattern 1811 may cover the surface of the second molding layer 150 and have an opening for exposing the conductive post 140. The first lower wiring pattern 1831 may be arranged on the first lower insulating pattern 1811 and connected to the conductive post 140 through the opening of the first lower insulating pattern 1811. Furthermore, the second lower insulating pattern 1813 may be formed on the first lower insulating pattern 1811 to cover the first lower wiring pattern 1831, and may have an opening for exposing part of the first lower wiring pattern 1831. The second lower wiring pattern 1833 may be arranged on the second lower insulating pattern 1813 and connected to the first lower wiring pattern 1831 through the opening of the second lower insulating pattern 1813.

In some embodiments, the second lower wiring pattern 1833 may function as an external connection pad and may be, for example, an under bump metal (UBM). The external connection terminal 170 may be arranged on the second lower wiring pattern 1833. The external connection terminal 170 may include, for example, a solder ball or a solder bump. The external connection terminal 170 may be electrically connected to the pad 111 of the semiconductor chip 110 through the lower wiring pattern 183, the conductive post 140, and the wiring pattern 133, and may be configured to electrically connect the semiconductor package 100a to the external device. However, in some embodiments, the second lower wiring pattern 1833 may be omitted. In this case, the external connection terminal 170 may be arranged on the first lower wiring pattern 1831 exposed through the second lower insulating pattern 1813.

Figure 5:
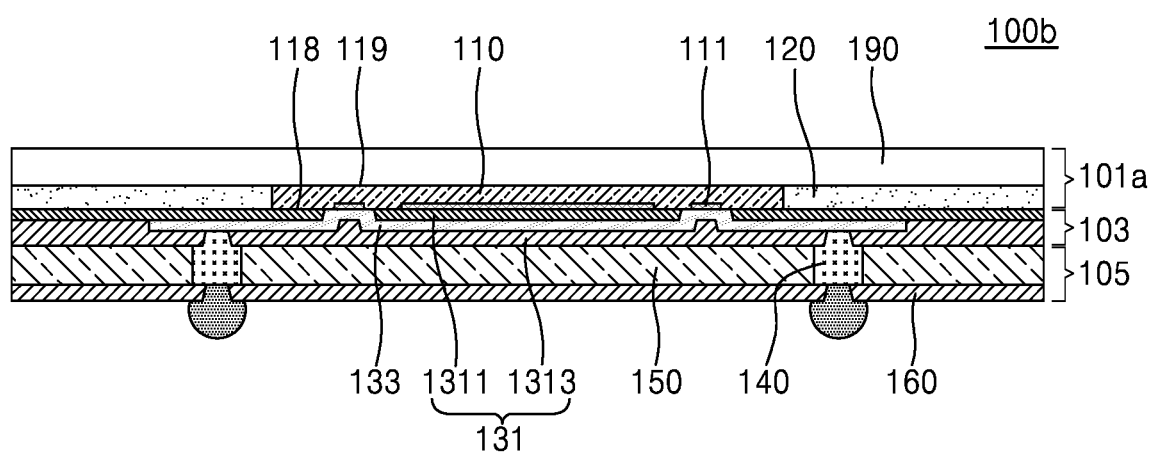
FIG. 5 is a cross-sectional view of a semiconductor package according to embodiments of the disclosure.

FIG. 5 is a cross-sectional view of a semiconductor package 100b according to embodiments of the disclosure. The semiconductor package 100b illustrated in FIG. 5 may have substantially the same configuration as the semiconductor package 100 of FIG. 1, except that an upper structure 101a further includes a heat dissipation plate 190.

Referring to FIG. 5, the semiconductor package 100b may include the upper structure 101a, the lower structure 105 including the conductive post 140 electrically connected to the semiconductor chip 110 and the second molding layer 150 for molding the conductive post 140, and the redistribution structure 103 provided between the upper structure 101a and the lower structure 105, in which the upper structure 101a may include the semiconductor chip 110, the first molding layer 120 for molding the semiconductor chip 110, and the heat dissipation plate 190.

While molding the semiconductor chip 110, the first molding layer 120 may not cover the second surface 119 of the semiconductor chip 110. In other words, the first molding layer 120 may have an exposed mold structure of covering the side surface of the semiconductor chip 110 and exposing the second surface 119 of the semiconductor chip 110.

The heat dissipation plate 190 may be provided on the second surface 119 of the semiconductor chip 110 and the first molding layer 120. In detail, although not illustrated, as necessary, an adhesive layer for adhering the heat dissipation plate 190 to the semiconductor chip 110 and the first molding layer 120 may be provided between the heat dissipation plate 190 and the semiconductor chip 110 and between the heat dissipation plate 190 and the first molding layer 120. The heat dissipation plate 190 may dissipate heat generated from the semiconductor chip 110 to the outside.

For example, the heat dissipation plate 190 may include a material exhibiting high thermal conductivity. For example, the heat dissipation plate 190 may include a metal material such as copper or aluminum.

In some embodiments, the heat dissipation plate 190 may have a thermal expansion coefficient of a level equivalent to a thermal expansion coefficient of the circuit substrate 400 on which the semiconductor package 100b is mounted. As the heat dissipation plate 190 covering the semiconductor chip 110 is formed to have a thermal expansion coefficient of a level equivalent to the thermal expansion coefficient of the circuit substrate 400, a difference in thermal expansion coefficient between the circuit substrate 400 and the semiconductor package 100b may be reduced, and warpage due to thermal expansion stress may be reduced.

Figure 6:
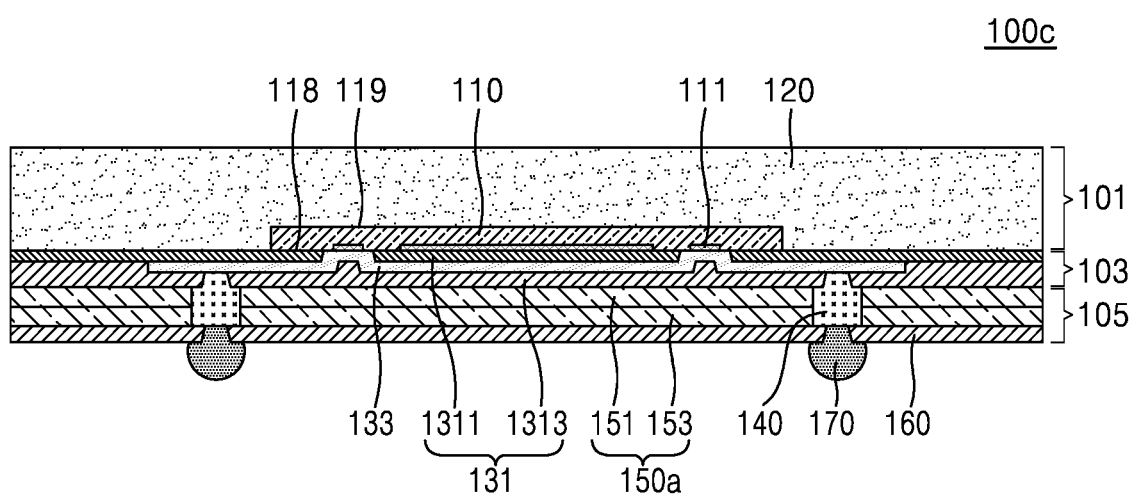
FIG. 6 is a cross-sectional view of a semiconductor package according to embodiments of the disclosure.

FIG. 6 is a cross-sectional view of a semiconductor package 100c according to embodiments of the disclosure. The semiconductor package 100c illustrated in FIG. 6 may have substantially the same configuration as the semiconductor package 100 of FIG. 1, except a configuration of a second molding layer 150a.

Referring to FIG. 6, the semiconductor package 100c may include the upper structure 101 including the semiconductor chip 110 and the first molding layer 120 for molding the semiconductor chip 110, the lower structure 105 including the conductive post 140 electrically connected to the semiconductor chip 110 and the second molding layer 150a for molding the conductive post 140, and the redistribution structure 103 provided between the upper structure 101 and the lower structure 105.

The second molding layer 150a may include a plurality of sub-molding layers 151 and 153. For example, the second molding layer 150a may include a first sub-molding layer 151 and a second sub-molding layer 153, which are sequentially stacked on the redistribution structure 103.

In some embodiments, the thermal expansion coefficients of the first sub-molding layer 151 and the second sub-molding layer 153 may be different from each other. In this state, the first sub-molding layer 151 may be arranged closer to the first molding layer 120 than the second sub-molding layer 153 is, and the thermal expansion coefficient of the first sub-molding layer 151 may be between the first thermal expansion coefficient of the first molding layer 120 and the thermal expansion coefficient of the second sub-molding layer 153. For example, the first sub-molding layer 151 may have a thermal expansion coefficient between about 10 $\mu m \cdot m^{-1} \cdot k^{-1}$ and about 13 $\mu m \cdot m^{-1} \cdot k^{-1}$, and the second sub-molding layer 153 may have a thermal expansion coefficient between about 13 $\mu m \cdot m^{-1} \cdot k^{-1}$ and about 16 $\mu m \cdot m^{-1} \cdot k^{-1}$. In this case, the thermal expansion coefficient of the second molding layer 150a may gradually increase in a direction from the first molding layer 120 toward the circuit substrate 400 of FIG. 2, and thus thermal expansion stress generated due to a difference in thermal expansion coefficient between the semiconductor package 100c and the circuit substrate 400 may be more effectively reduced.

Although FIG. 6 illustrates that the second molding layer 150a includes two sub-molding layers, the number of sub-molding layers is not limited thereto. For example, the second molding layer 150a may include three sub-molding layers.

Figure 7:
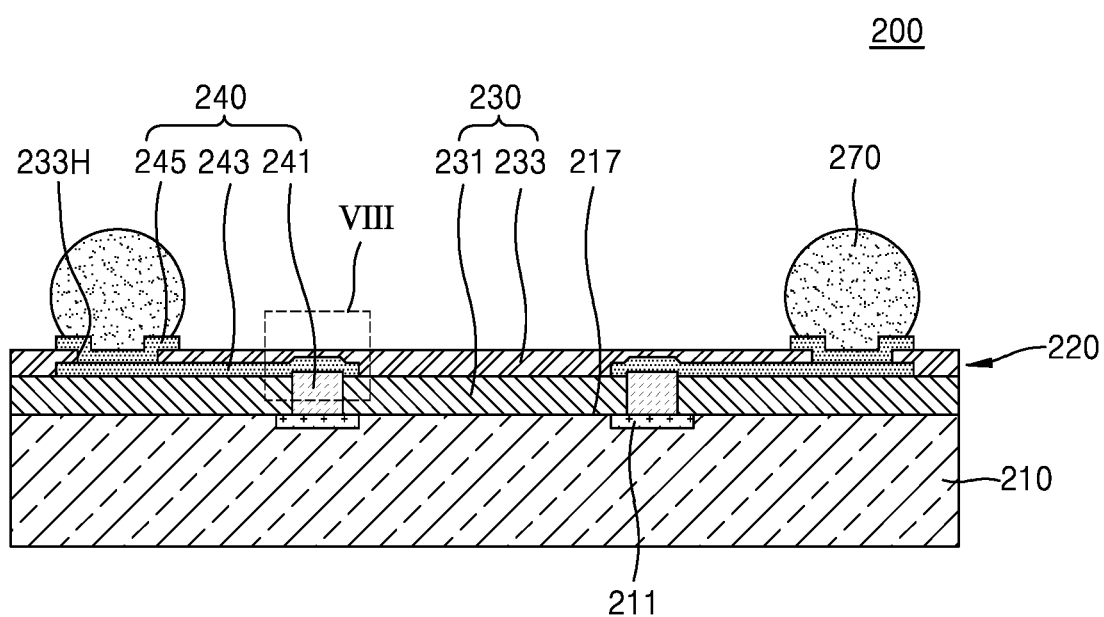
FIG. 7 is a cross-sectional view of a semiconductor package according to embodiments of the disclosure.
Figure 8:
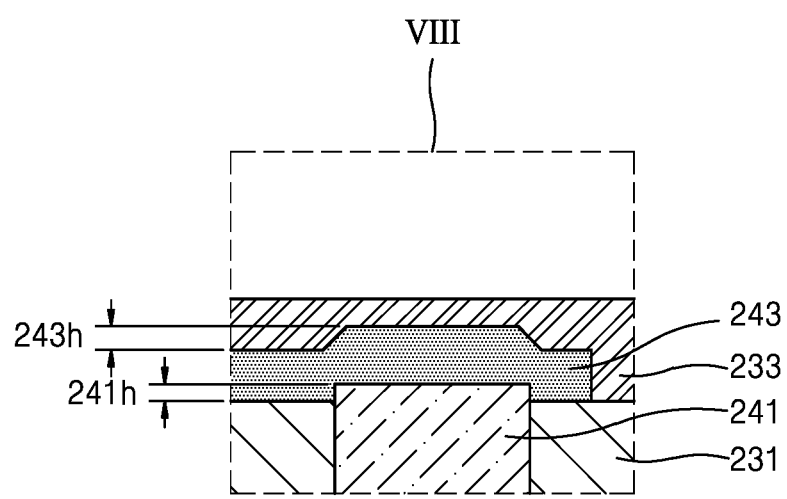
FIG. 8 is an enlarged view of a region "VIII" of FIG. 7.

FIG. 7 is a cross-sectional view of a semiconductor package 200 according to embodiments of the disclosure. FIG. 8 is an enlarged view of a region "VIII" of FIG. 7.

Referring to FIGS. 7 and 8, the semiconductor package 200 may include a semiconductor chip 210 and a redistribution structure 220 on the semiconductor chip 210.

Various types of a plurality of individual devices may be formed on the semiconductor chip 210. For example, the individual devices may include various microelectronic devices, for example, metal-oxide-semiconductor field effect transistors (MOSFETs) such as complementary metal-insulator-semiconductor (CMOS) transistors, and the like, system large scale integration (LSI), image sensors such as CMOS imaging sensors (CISs) and the like, micro-electromechanical systems (MEMSs), active devices, passive devices, and the like.

The semiconductor chip 210 may include a chip pad 211 provided on a first surface 217. The chip pad 211 may be electrically connected to a semiconductor device formed on the semiconductor chip 210. Furthermore, in detail, although not illustrated, the semiconductor chip 210 may include a passivation film covering the first surface 217.

In some embodiments, the semiconductor chip 210 may include, for example, a memory semiconductor chip. The memory semiconductor chip may include, for example, volatile memory semiconductor chips such as dynamic random access memory (DRAM) or static random access memory (SRAM), or non-volatile memory semiconductor chips such as phase-change random access memory (PRAM), magnetoresistive random access memory (MRAM), ferroelectric random access memory (FeRAM), or resistive random access memory (RRAM).

Alternatively, in some embodiments, the semiconductor chip 210 may include a logic chip. For example, the semiconductor chip 210 may include a central processor unit (CPU), a microprocessor unit (MPU), a graphic processor unit (GPU), or an application processor (AP).

Furthermore, although FIG. 7 illustrates that the semiconductor package 200 includes one semiconductor chip, the semiconductor package 200 may include two or more semiconductor chips. The two or more semiconductor chips included in the semiconductor package 200 may be homogeneous semiconductor chips or heterogeneous semiconductor chips. In some embodiments, the semiconductor package 200 may be a system in package (SIP) in which different types of semiconductor chips and electronic components are electrically connected to each other to operate as one system.

The redistribution structure 220 may be provided on the first surface 217 of the semiconductor chip 210. The redistribution structure 220 may include an insulating pattern 230 and an interconnection structure 240.

The insulating pattern 230 may be arranged on the first surface 217 of the semiconductor chip 210. The insulating pattern 230 may have a structure in which a plurality of insulating films are stacked, and may include, for example, a first insulating pattern 231 and a second insulating pattern 233, which are sequentially stacked.

For example, the first insulating pattern 231 and the second insulating pattern 233 each may include an insulating polymer, epoxy, a silicon oxide film, a silicon nitride film, or a combination thereof. Alternatively, the first insulating pattern 231 and the second insulating pattern 233 each may include a non-photosensitive material or a photosensitive material.

In some embodiments, the first insulating pattern 231 and the second insulating pattern 233 may include materials different from each other. For example, the first insulating pattern 231 may include a non-photosensitive material, for example, non-photosensitive polyimide, and the second insulating pattern 233 may include a photosensitive material, for example, photosensitive polyimide.

Alternatively, in other embodiments, the first insulating pattern 231 and the second insulating pattern 233 may include the same material. For example, the first insulating pattern 231 and the second insulating pattern 233 may include non-photosensitive polyimide or photosensitive polyimide.

In some embodiments, the thermal expansion coefficient of the first insulating pattern 231 may be different from the thermal expansion coefficient of the second insulating pattern 233. For example, the thermal expansion coefficient of the first insulating pattern 231 may be greater than the thermal expansion coefficient of the second insulating pattern 233. Alternatively, the thermal expansion coefficient of the first insulating pattern 231 may be less than the thermal expansion coefficient of the second insulating pattern 233.

In some embodiments, the surface roughness of an upper surface of the first insulating pattern 231 in contact with a lower surface of the second insulating pattern 233 may be different from the surface roughness of a lower surface of the first insulating pattern 231.

Furthermore, in some embodiments, the surface roughness of the first insulating pattern 231 may be different from the surface roughness of the second insulating pattern 233. For example, the surface roughness of the upper surface of the first insulating pattern 231 may be greater than the surface roughness of the lower surface of the second insulating pattern 233 and the surface roughness of an upper surface of the second insulating pattern 233.

In some embodiments, a thickness of the first insulating pattern 231 may be between about 10 micrometers and about 70 micrometers. Alternatively, the thickness of the first insulating pattern 231 may be between about 20 micrometers and about 60 micrometers or between about 30 micrometers and about 50 micrometers. Furthermore, a thickness of the second insulating pattern 233 may be between about 10 micrometers and about 70 micrometers. Alternatively, the thickness of the second insulating pattern 233 may be between about 20 micrometers and about 60 micrometers or between about 30 micrometers and about 50 micrometers.

Generally, compared to a case in which the insulating film of a wafer-level package has a thickness of about 5 micrometers, the first insulating pattern 231 and the second insulating pattern 233 may be formed to be relatively thick. As the first insulating pattern 231 and the second insulating pattern 233 are formed to be thick, the first insulating pattern 231 and the second insulating pattern 233 may function as a buffer to external shocks, and thus, the reliability of the semiconductor package 200 may be enhanced. In particular, as the second insulating pattern 233 at the outermost side is formed to be thick, stress applied to an external connection terminal 270 provided between a mounting substrate on which the semiconductor package 200 is mounted and the second insulating pattern 233 may be much reduced.

The interconnection structure 240 may be electrically connected to the chip pad 211 of the semiconductor chip 210, and may provide an electrical connection path for electrically connecting the chip pad 211 to an external device.

For example, the interconnection structure 240 may include a first conductive bump 241, a first wiring pattern 243, and a second wiring pattern 245. In detail, the first conductive bump 241 may penetrate the first insulating pattern 231, and may be connected to the chip pad 211 of the semiconductor chip 210. The first wiring pattern 243 may be provided on the first insulating pattern 231. The first wiring pattern 243, as a trace extending from the first insulating pattern 231, may electrically connect the first conductive bump 241 to the second wiring pattern 245. The second wiring pattern 245 may be connected to the first wiring pattern 243 through an opening 233H of the second insulating pattern 233.

The second wiring pattern 245 may function as an external connection pad and include, for example, an under bump metal (UBM). The external connection terminal 270 may be arranged on the second wiring pattern 245. The external connection terminal 270 may include, for example, a solder ball or a solder bump. The external connection terminal 270 may be electrically connected to the chip pad 211 of the semiconductor chip 210 through the interconnection structure 240, and may be configured to electrically connect the semiconductor package 200 to the external device. However, in some embodiments, the second wiring pattern 245 may be omitted. In this case, the external connection terminal 270 may be arranged directly on the first wiring pattern 243 exposed through the opening 233H of the second insulating pattern 233.

In some embodiments, the interconnection structure 240 may include a conductive material, for example, W, Cu, Zr, Ti, Ta, Al, Ru, Pd, Pt, Co, Ni, or a combination thereof. The first conductive bump 241, the first wiring pattern 243 and the second wiring pattern 245 may include the same material or a combination of the same materials. Alternatively, the first conductive bump 241, the first wiring pattern 243, and the second wiring pattern 245 may include materials different from each other or a combination of different materials.

As illustrated in FIG. 8, the first conductive bump 241 may penetrate the first insulating pattern 231, and may have a shape of a pillar standing on the chip pad 211 of the semiconductor chip 210.

In some embodiments, the first conductive bump 241 may protrude from the first insulating pattern 231. For example, a height 241h of the first conductive bump 241 protruding from the upper surface of the first insulating pattern 231 may be between about 0.1 micrometers and about 20 micrometers. For example, the height 241h of the first conductive bump 241 protruding from the upper surface of the first insulating pattern 231 may be about 0.1 micrometers or more, about 1 micrometer or more, or about 5 micrometers or more. Furthermore, the height 241h of the first conductive bump 241 protruding from the upper surface of the first insulating pattern 231 may be about 20 micrometers or less, about 15 micrometers or less, or about 10 micrometers or less.

As the first conductive bump 241 protrudes from the first insulating pattern 231, the first wiring pattern 243 may be in contact with the side wall of the first conductive bump 241 and an upper surface of the first conductive bump 241. As the first wiring pattern 243 is in contact with the side wall of the first conductive bump 241, a contact area between the first wiring pattern 243 and the first conductive bump 241 may increase, and thus, the contact resistance between the first wiring pattern 243 and the first conductive bump 241 may decrease.

Furthermore, the first wiring pattern 243 may have a step portion corresponding to the height 241h of the first conductive bump 241 protruding from the first insulating pattern 231. In other words, a height 243h of the step portion of the first wiring pattern 243 may correspond to the height 241h of the first conductive bump 241 protruding from the upper surface of the first insulating pattern 231. In detail, on the first conductive bump 241, the first wiring pattern 243 may have a structure inclined downward in a direction away from the first conductive bump 241.

Figure 9:
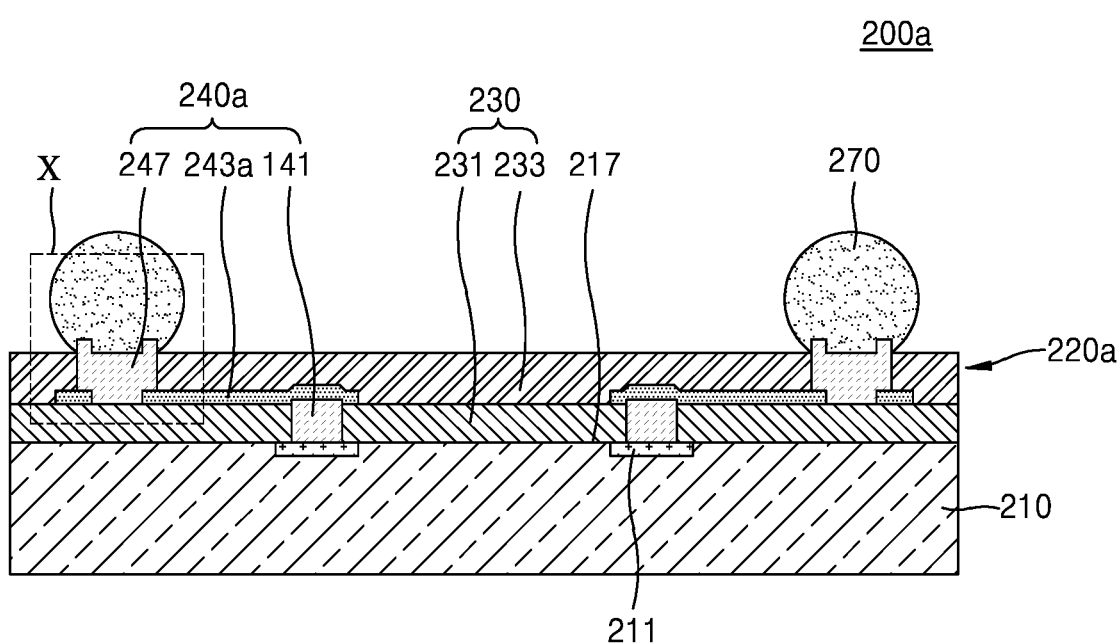
FIG. 9 is a cross-sectional view of a semiconductor package according to embodiments of the disclosure.
Figure 10:
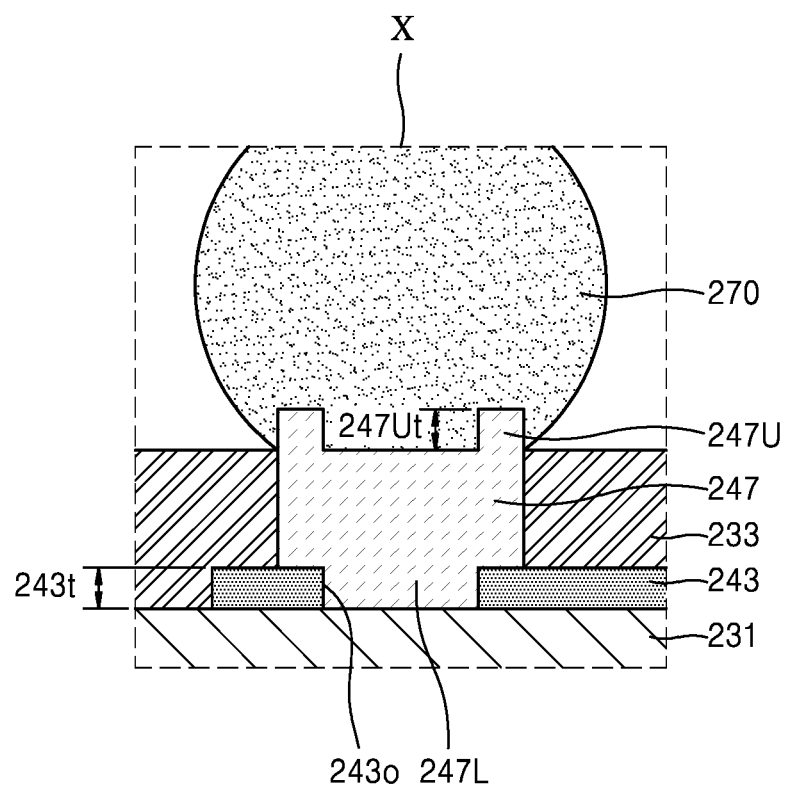
FIG. 10 is an enlarged view of a region "X" of FIG. 9.

FIG. 9 is a cross-sectional view of a semiconductor package 200a according to embodiments of the disclosure. FIG. 10 is an enlarged view of a region "X" of FIG. 9. The semiconductor package 200a illustrated in FIGS. 9 and 10 may have substantially the same configuration as the semiconductor package 200 of FIGS. 7 and 8, except that an interconnection structure 240a of a redistribution structure 220a includes a second conductive bump 247. In FIGS. 9 and 10, descriptions redundant to those of FIGS. 7 and 8 are omitted or briefly presented.

Referring to FIGS. 9 and 10, the interconnection structure 240a may include the second conductive bump 247 that electrically connects the first wiring pattern 243a to the external connection terminal 270. The second conductive bump 247 may penetrate the second insulating pattern 233, and may have a shape of a pillar standing on the first insulating pattern 231.

In some embodiments, the second conductive bump 247 may be in contact with the upper surface of the first insulating pattern 231 by penetrating the first wiring pattern 243. A lower portion 247L of the second conductive bump 247 may be formed by filling an opening 243o of the first wiring pattern 243, and the lower portion 247L of the second conductive bump 247 may have a shape in which a center portion thereof protrudes downward. As illustrated, a height of the center portion of the lower portion 247L of the second conductive bump 247, the center portion protruding downward, may correspond to a thickness 243*t* of the first wiring pattern 243.

Furthermore, an upper portion 247U of the second conductive bump 247 may protrude from the second insulating pattern 233 and have a shape in which a center portion thereof collapses. The collapsed center portion of the upper portion 247U of the second conductive bump 247 may be filled with the external connection terminal 270. As the center portion of the upper portion 247U of the second conductive bump 247 has a collapsed shape, a contact area between the second conductive bump 247 and the external connection terminal 270 increases, and thus, mechanical connection and electrical connection between the second conductive bump 247 and the external connection terminal 270 may be improved.

A depth 247Ut of the collapsed center portion of the upper portion 247U of the second conductive bump 247 may correspond to the thickness 243*t* of the first wiring pattern 243.

In some embodiments, the depth 247Ut of the collapsed center portion of the upper portion 247U of the second conductive bump 247 may be between about 0.1 micrometers and about 20 micrometers. Alternatively, the depth 247Ut of the collapsed center portion of the upper portion 247U of the second conductive bump 247 may be between about 1 micrometer and about 10 micrometers or between about 3 micrometers and about 7 micrometers.

In some embodiments, the external connection terminal 270 may cover the second conductive bump 247. For example, the external connection terminal 270 may cover an upper surface and a side wall of the upper portion 247U of the second conductive bump 247. As the external connection terminal 270 covers the second conductive bump 247, a contact area between the second conductive bump 247 and the external connection terminal 270 may increase, and furthermore, the second conductive bump 247 may be prevented from being damaged due to exposure to the outside.

FIGS. 11A to 11G are cross-sectional views of a method of manufacturing the semiconductor package 200 of FIG. 7 in order.

Figure 11A:
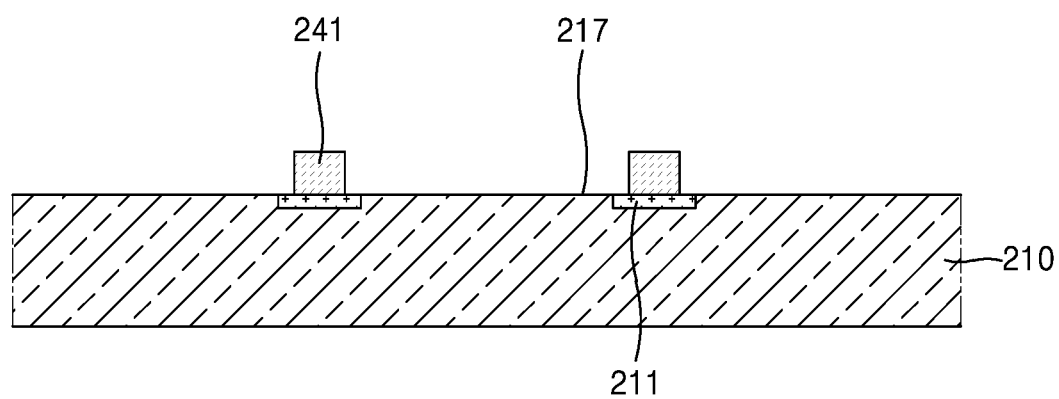
FIGS. 11A to 11G are cross-sectional views of a method of manufacturing the semiconductor package of FIG. 7 in order.

Referring to FIG. 11A, the first conductive bump 241 is formed on the semiconductor chip 210. For example, to form the first conductive bump 241, a sacrifice insulating film having an opening for exposing the chip pad 211 of the semiconductor chip 210 is formed, and a plating process to fill the opening of the sacrifice insulating film with a conductive material may be performed. The first conductive bump 241 may have a shape of a pillar standing on the chip pad 211 of the semiconductor chip 210.

Figure 11B:
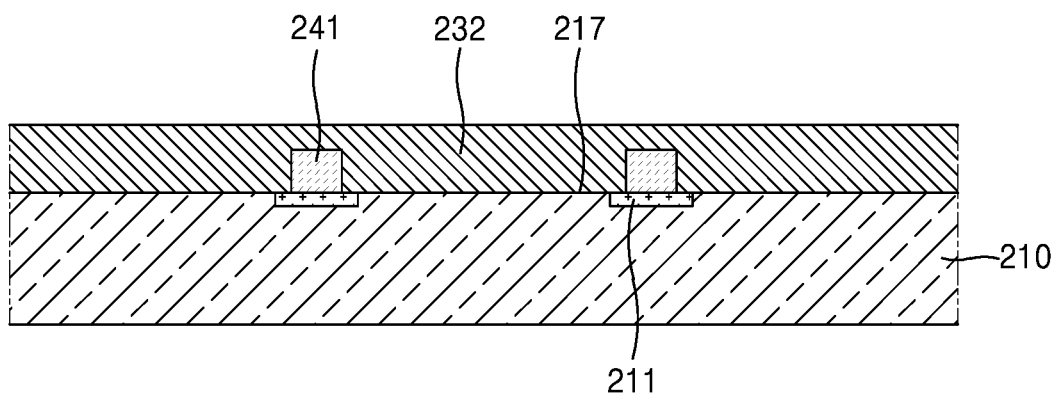

Referring to FIG. 11B, a first insulating film 232 covering the semiconductor chip 210 and the first conductive bump 241 is formed.

In some embodiments, the first insulating film 232 may be formed through a film lamination process using an insulating film in a solid state. For example, an insulating film in a semi-curing state, that is, a B-stage, may be applied to the semiconductor chip 210, and a pre-curing process is performed, thereby forming the first insulating film 232.

Generally, when the insulating film is formed by using a material in a liquid state, residual stress may be generated in the insulating film in a thermal contraction process for a material in a liquid state. However, according to embodiments of the disclosure, as the first insulating film 232 is formed by using the insulating film in a solid state, the generation of residual stress due to the thermal contraction may be reduced. Furthermore, as the first insulating film 232 is formed by using the insulating film in a solid state, the first insulating film 232 having a relatively thick thickness may be easily formed.

Figure 11C:
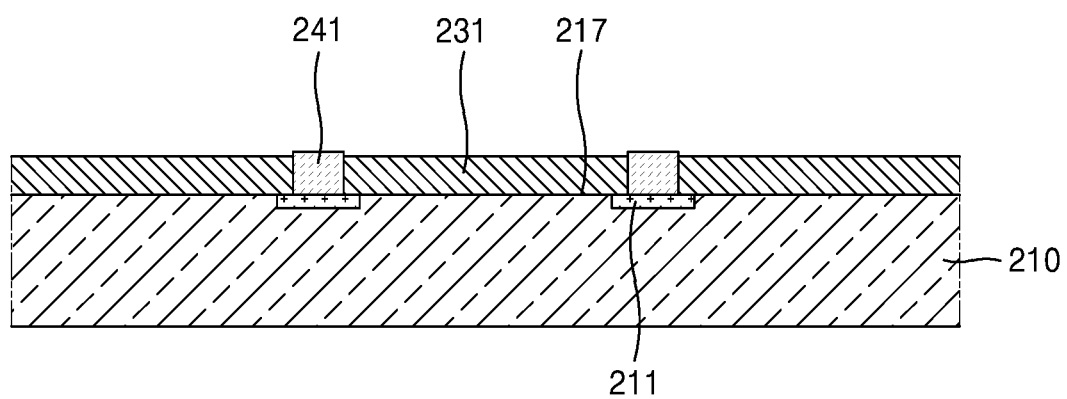

Referring to FIG. 11C, the first insulating pattern 231 for exposing at least part of the first conductive bump 241 is formed by removing part of the first insulating film 132 of FIG. 11B. As a result of the removing of the part of the first insulating film 232, the first conductive bump 241 may protrude from the upper surface of the first insulating pattern 231, and the upper surface of the first insulating pattern 231 may be lower than the upper surface of the first conductive bump 241. For example, an etch back process or polishing process may be performed to remove part of the first insulating film 232.

In some embodiments, the part of the first insulating film 232 may be removed through an etching process on the entire surface of the first insulating film 232. Through the etching process on the entire surface of the first insulating film 232, the surface roughness of the upper surface of the first insulating pattern 231 may be greater than the surface roughness of an upper surface of the first insulating film 232. The surface roughness of the upper surface of the first insulating pattern 231 may be greater than the surface roughness of an upper surface of the second insulating pattern 133 of FIG. 11E and the surface roughness of the lower surface of the second insulating pattern 233, which are formed through a subsequent process. As the surface roughness of the upper surface of the first insulating pattern 231 increases, adhesion between the first wiring pattern 243 and the first insulating pattern 231, which are formed through the subsequent process, may be enhanced.

Figure 11D:
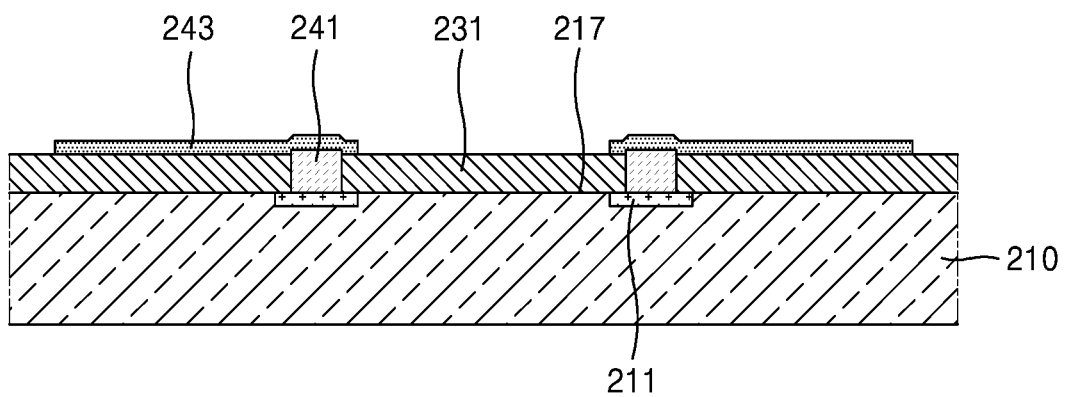

Referring to FIG. 11D, the first wiring pattern 243 is formed on the first insulating pattern 231. The first wiring pattern 243 may extend along the upper surface of the first insulating pattern 231 and may be connected to the first conductive bump 241. In this state, the first wiring pattern 243 may have a step portion corresponding to the height of the first conductive bump 241 protruding from the upper surface of the first insulating pattern 231.

In some embodiments, to form the first wiring pattern 243, a seed metal layer covering the first insulating pattern 231 may be formed, and a plating process using the seed metal layer as a seed may be performed. For example, the first wiring pattern 243 may be formed through immersion plating, electroless plating, electroplating, or a combination thereof.

Figure 11E:
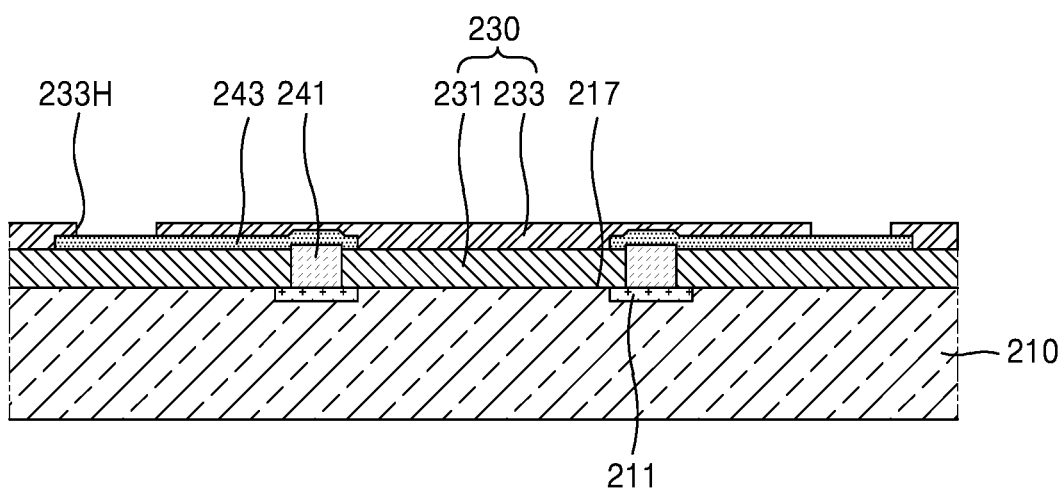

Referring to FIG. 11E, the second insulating pattern 233 is formed on the first insulating pattern 231. While covering the first wiring pattern 243, the second insulating pattern 233 may be formed to have the opening 233H for exposing part of the first wiring pattern 243. For example, to form the second insulating pattern 233, a second insulating film may be formed through a film lamination process using an insulating film in a solid state, and the opening 233H may be formed in the second insulating film through an exposure and development process.

Figure 11F:
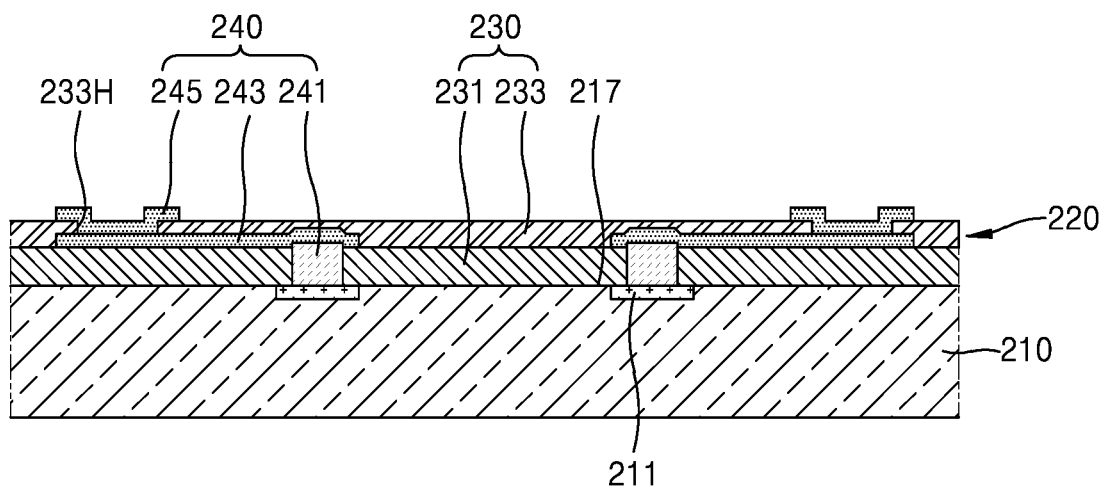

Referring to FIG. 11F, after the second insulating pattern 233 is formed, the second wiring pattern 245 is formed. The second wiring pattern 245 may be connected to the first wiring pattern 243 that is exposed through the opening 233H of the second insulating pattern 233. The second wiring pattern 245 may be formed through a method similar to the method of forming the first wiring pattern 243 described with reference to FIG. 11D.

Figure 11G:
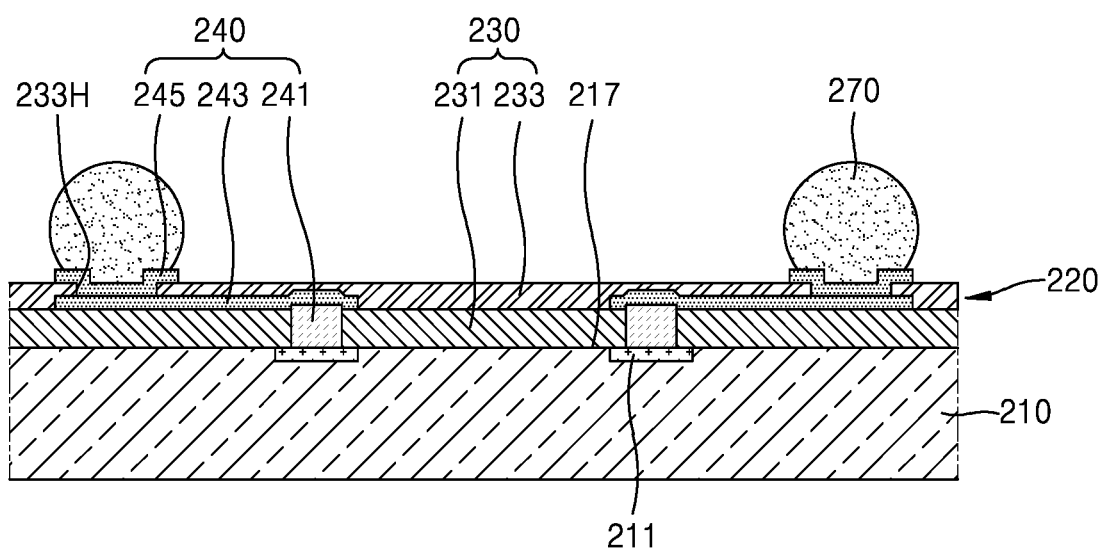

Referring to FIG. 11G, after the second wiring pattern 245 is formed, the external connection terminal 270 may be formed on the second wiring pattern 245.

Thereafter, a semiconductor package manufactured at a wafer level may be cut along a scribe lane and individualized into semiconductor packages of individual units.

FIGS. 12A to 12E are cross-sectional views of a method of manufacturing the semiconductor package 200a of FIG. 9 in order.

Figure 12A:
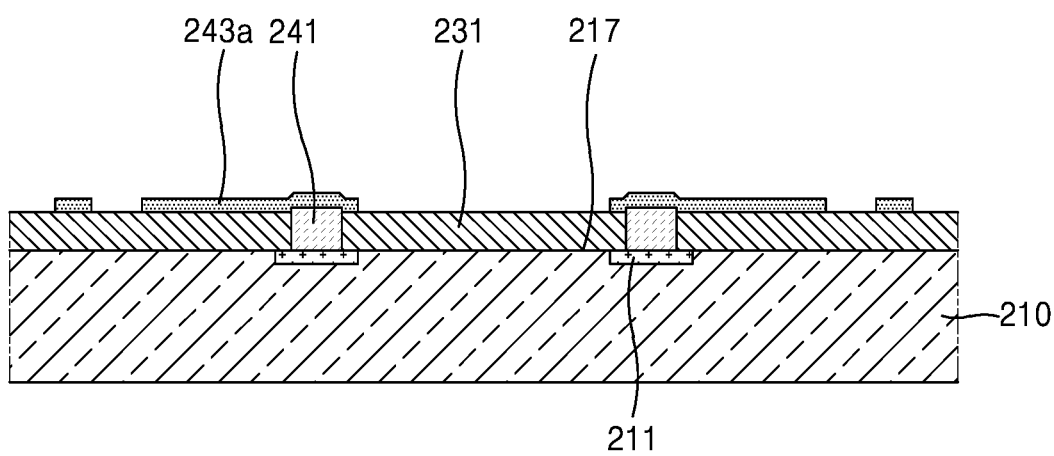
FIGS. 12A to 12E are cross-sectional views of a method of manufacturing the semiconductor package of FIG. 9 in order.

Referring to FIG. 12A, a structure corresponding to a resultant of FIG. 11C is prepared, and a first wiring pattern 243a is formed on the first insulating pattern 231. The first wiring pattern 243a may extend along the surface of the first insulating pattern 231, and may be connected to the first conductive bump 241. The first wiring pattern 243a may have the opening 243o that is filled with a second conductive bump 147 of FIG. 12B described below.

Figure 12B:
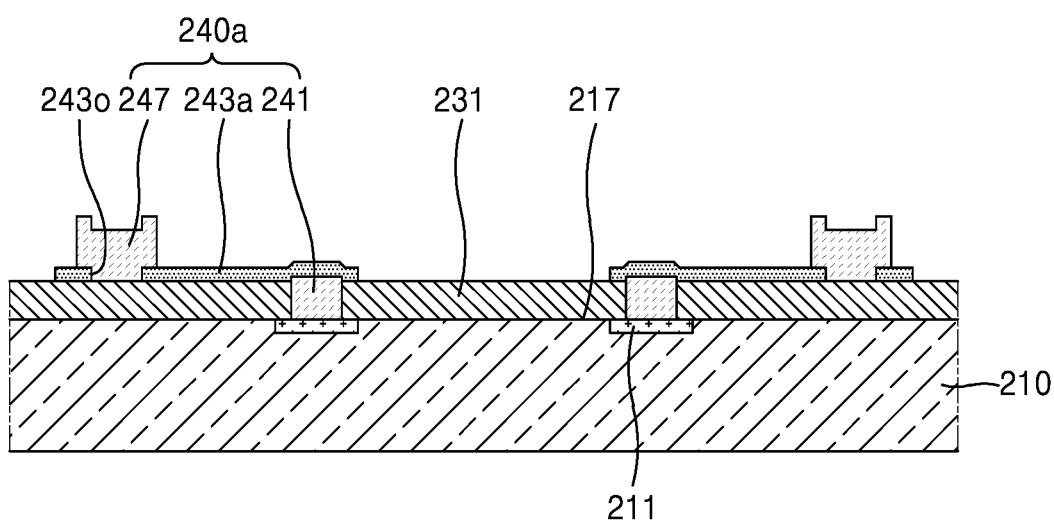

Referring to FIG. 12B, after the first wiring pattern 243a is formed, the second conductive bump 247 is formed on the first insulating pattern 231. For example, to form the second conductive bump 247, a sacrifice insulating film having an opening for exposing part of the first wiring pattern 243a may be formed, and a plating process of filling the opening of the sacrifice insulating film with a conductive material may be performed. The second conductive bump 247 may have a shape of a pillar standing on the first insulating pattern 231. A lower portion of the second conductive bump 247 may be in contact with the upper surface of the first insulating pattern 231 through the opening 243o of the first wiring pattern 243a, and an upper portion of the second conductive bump 247 may have a shape in which a center portion thereof collapses downward.

Figure 12C:
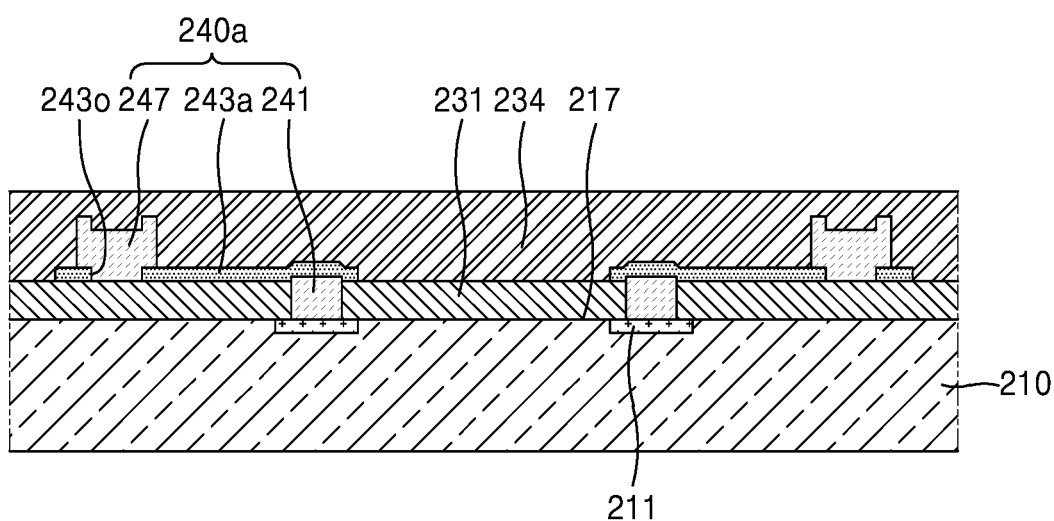

Referring to FIG. 12C, a second insulating film 234 is formed on the first insulating pattern 231. The second insulating film 234 may cover the first wiring pattern 243a and the second conductive bump 247. In some embodiments, the second insulating film 234 may be formed through a film lamination process by using an insulating film. However, a method of forming the second insulating film 234 is not limited thereto, and for example, the second insulating film 234 may be formed by using a spin coating process.

Figure 12D:
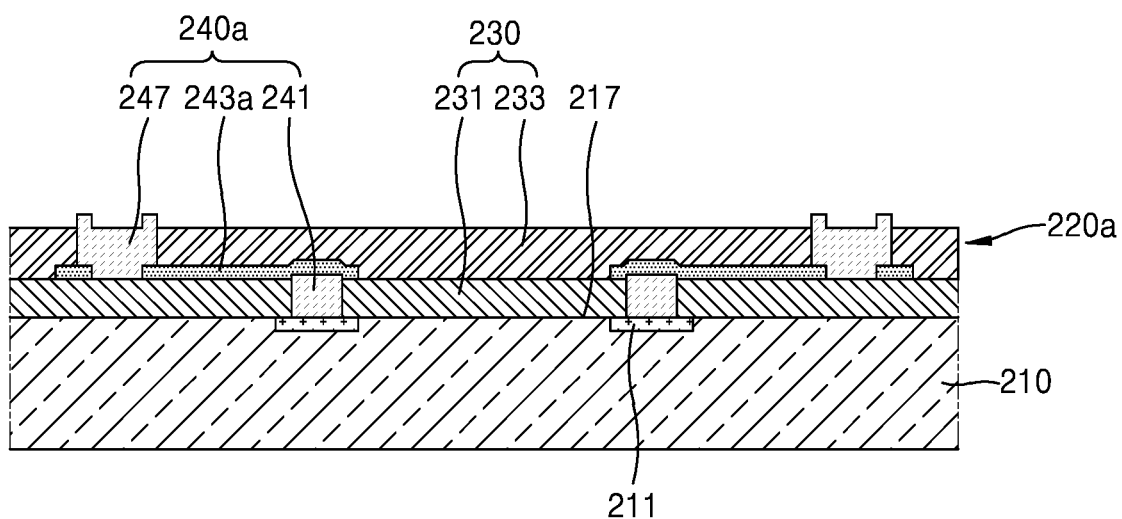

Referring to FIG. 12D, the second insulating pattern 233 for exposing the at least part of the second conductive bump 247 is formed by removing part of the second insulating film 234 of FIG. 12C to expose at least part of the second conductive bump 247. As a result of the removing of part of the second insulating film 234, an edge part of the upper portion of the second conductive bump 247 may protrude from the upper surface of the second insulating pattern 233. For example, an etch back process or a polishing process may be performed to remove the part of the second insulating film 234.

In some embodiments, an etching process may be performed on the entire surface of the second insulating film 234 to expose the at least part of the second conductive bump 247. When the first conductive bump 241 is exposed through an etching process on the entire surface of the first insulating film 232 of FIG. 11B as described above, the surface roughness of the upper surface of the first insulating pattern 231 and the surface roughness of the second insulating pattern 233 may be substantially the same.

Figure 12E:
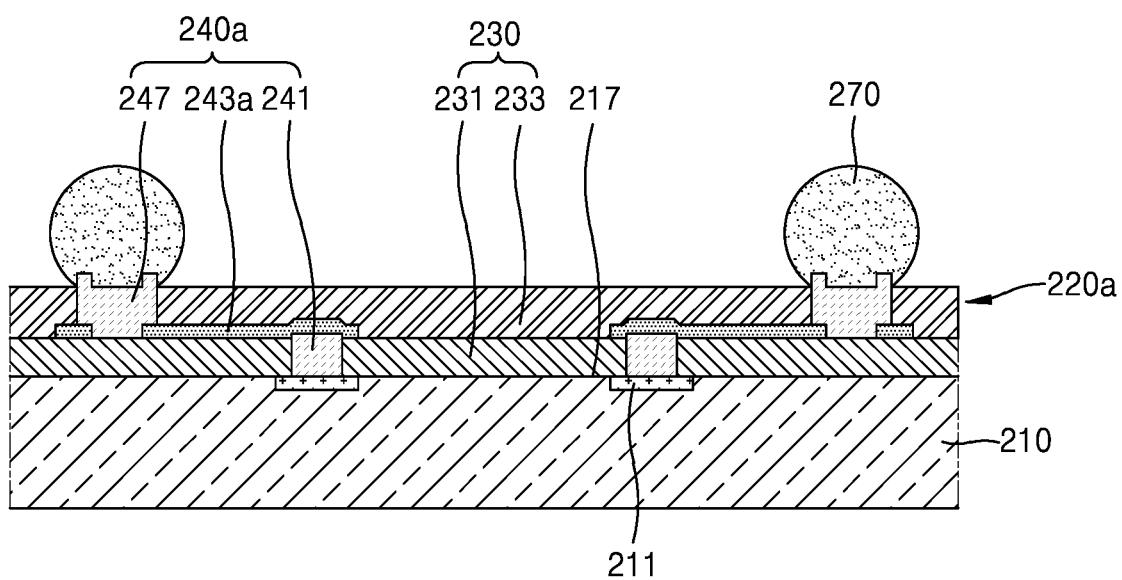

Referring to FIG. 12E, after the part of the second insulating film 234 of FIG. 12C is removed to expose the second conductive bump 247, the external connection terminal 270 may be formed on the second conductive bump 247.

Thereafter, a semiconductor package manufactured at a wafer level may be cut along a scribe lane and individualized into semiconductor packages of individual units.

Figure 13:
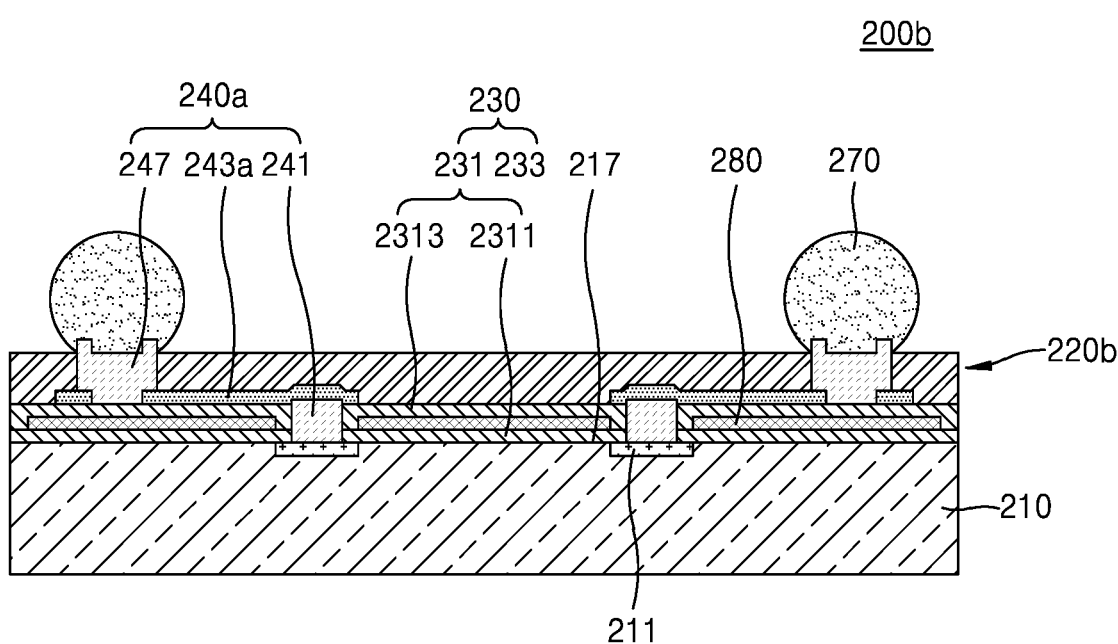
FIG. 13 is a cross-sectional view of a semiconductor package according to embodiments of the disclosure.
Figure 14A:
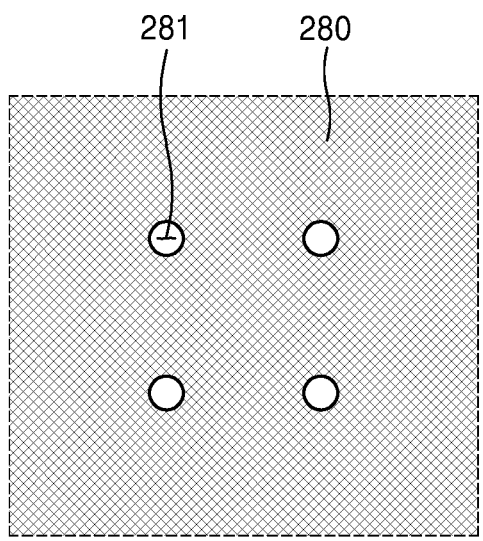
FIGS. 14A and 14B are plan views of a shield layer of FIG. 13.
Figure 14B:
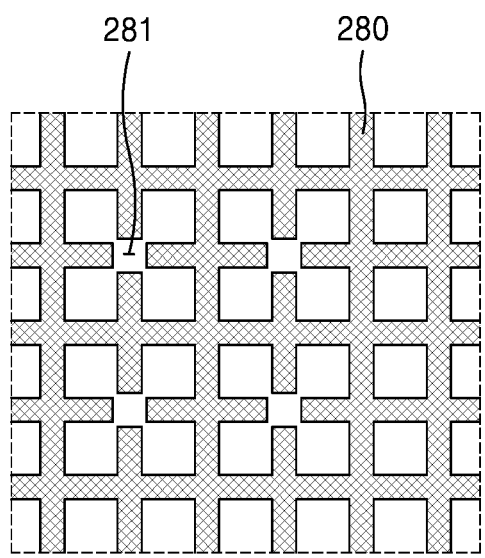

FIG. 13 is cross-sectional view of a semiconductor package 200b according to embodiments of the disclosure. FIGS. 14A and 14B are plan views of a shield layer 280 of FIG. 13. The semiconductor package 200b illustrated in FIG. 13 may have substantially the same configuration as the semiconductor package 200a of FIGS. 9 and 10, except that a redistribution structure 220b further includes the shield layer 280. In FIGS. 13,14A, and 14B, descriptions redundant to those provided above are omitted or briefly presented.

Referring to FIG. 13, the redistribution structure 220b may include the shield layer 280. The shield layer 280 may be arranged above the semiconductor chip 210 and may shield electromagnetic interference (EMI), thereby preventing degradation of the performance of the semiconductor chip 210 due to the EMI. For example, the shield layer 280 may include a conductive material such as copper (Cu), silver (Ag), platinum (Pt), and the like.

For example, the shield layer 280 may be provided in the first insulating pattern 231 to be spaced apart from the first conductive bump 241. For example, the first insulating pattern 231 may include a first sub-insulating layer 2311 and a second sub-insulating layer 2313, which are sequentially stacked on the first surface 217 of the semiconductor chip 210, and the shield layer 280 may be formed between the first sub-insulating layer 2311 and the second sub-insulating layer 2313. In some embodiments, as the first insulating pattern 231 is formed to be thick, the shield layer 280 may be further formed without increasing the thickness of the redistribution structure 220b.

Although FIG. 13 illustrates that the shield layer 280 is arranged in the first insulating pattern 231, the disclosure is not limited thereto. For example, a second shield layer may be formed in the second insulating pattern 233. For example, when a second shield layer is arranged in the second insulating pattern 233, the second insulating pattern 233 may include a third sub-insulating layer and a fourth sub-insulating layer, which are sequentially stacked on the first insulating pattern 231, and the second shield layer may be provided between the third sub-insulating layer and the fourth sub-insulating layer to be spaced apart from the second conductive bump 247.

In some embodiments, as illustrated in FIG. 14A, while having a plate shape, the shield layer 280 may have an opening 281 through which the first conductive bump 241 passes.

Alternatively, in some embodiments, as illustrated in FIG. 14B, while having a mesh shape, the shield layer 280 may have an opening 281 through which the first conductive bump 241 passes.

While the disclosure has been particularly shown and described with reference to preferred embodiments using specific terminologies, the embodiments and terminologies should be considered in descriptive sense only and not for purposes of limitation. Therefore, it will be understood by those of ordinary skill in the art that various changes in form and details may be made therein without departing from the spirit and scope of the disclosure as defined by the following claims.

The invention claimed is:
1. A semiconductor package comprising:
   an upper structure comprising a semiconductor chip and a first molding layer for molding the semiconductor chip;

a lower structure provided on the upper structure, the lower structure comprising a conductive post and a second molding layer for molding the conductive post; and a redistribution structure provided between the upper structure and the lower structure, the redistribution structure comprising a wiring pattern for electrically connecting a pad of the semiconductor chip to the conductive post, wherein a thermal expansion coefficient of the second molding layer is different from a thermal expansion coefficient of the first molding layer;

wherein the first molding member and the second molding member are spaced apart from each other in a vertical direction with the redistribution structure interposed therebetween; and wherein the thermal expansion coefficient of the first molding member overlapping the semiconductor chip in a horizontal direction is smaller than the thermal expansion coefficient of the second molding member not overlapping the semiconductor chip in the horizontal direction.

2. The semiconductor package of claim 1, wherein
the redistribution structure comprises an insulating pattern covering the wiring pattern, and
the conductive post comprises a first portion surrounded by the insulating pattern and a second portion surrounded by the second molding layer.

3. The semiconductor package of claim 2, wherein a width of the first portion of the conductive post is less than a width of the second portion of the conductive post.

4. The semiconductor package of claim 2, wherein a thickness of the first portion is smaller than a thickness of the second portion.

5. The semiconductor package of claim 2, wherein a thickness of the second molding layer is greater than a thickness of the insulating pattern.

6. The semiconductor package of claim 1, further comprising an external connection terminal directly connected to one end of the conductive post.

7. The semiconductor package of claim 1, wherein the lower structure further comprises a lower insulating layer provided on the second molding layer and comprises an opening for exposing the conductive post.

8. The semiconductor package of claim 1, further comprising a lower redistribution structure provided on the lower structure, the lower redistribution structure comprising a lower wiring pattern electrically connected to the conductive post and a lower insulating pattern covering the lower wiring pattern.

9. The semiconductor package of claim 1, wherein the upper structure further comprises a heat dissipation plate provided on the semiconductor chip.

10. The semiconductor package of claim 1, wherein the second molding layer comprises a plurality of sub-molding layers that are sequentially stacked on the redistribution structure, and the plurality of sub-molding layers have thermal expansion coefficients that are different from each other.

11. The semiconductor package of claim 10, wherein:
the plurality of sub-molding layers includes a first sub-molding layer and a second sub- molding layer; and
a thermal expansion coefficient of the first sub-molding layer is between the thermal expansion coefficient of the first molding layer and a thermal expansion coefficient of the second sub-molding layer.

12. The semiconductor package of claim 1, wherein:
the semiconductor package is disposed on a circuit board; and
the thermal expansion coefficient of the second molding layer is between the thermal expansion coefficient of the first molding layer and a thermal expansion coefficient of the circuit board.

13. A semiconductor module comprising:
a circuit board; and
a semiconductor package disposed on the circuit board,
wherein the semiconductor package comprises:
a semiconductor chip;
a first molding layer surrounding the semiconductor chip and having a first thermal expansion coefficient;
a redistribution structure including a wiring pattern electrically connected to the semiconductor chip;
a second molding layer provided between the first molding layer and the circuit board in a vertical direction and having a second thermal expansion coefficient between a thermal expansion coefficient of the circuit board and the first thermal expansion coefficient;
a conductive post passing through the second molding layer and electrically connected to the wiring pattern; and
an external connection terminal configured to electrically connect the conductive post and a substrate pad of the circuit board;
wherein the first molding member and the second molding member are spaced apart from each other in the vertical direction with the redistribution structure interposed therebetween; and
wherein the thermal expansion coefficient of the first molding member overlapping the semiconductor chip in a horizontal direction is smaller than the thermal expansion coefficient of the second molding member not overlapping the semiconductor chip in the horizontal direction.

* * * * *